US006947455B2

(12) United States Patent
Chieng et al.

(10) Patent No.: US 6,947,455 B2
(45) Date of Patent: Sep. 20, 2005

(54) MAINTAINING DESIRABLE PERFORMANCE OF OPTICAL EMITTERS AT EXTREME TEMPERATURES

(75) Inventors: Yew-Tai Chieng, Singapore (SG); John Hsieh, Cupertino, CA (US); Greta L. Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 226 days.

(21) Appl. No.: 10/285,369

(22) Filed: Oct. 31, 2002

(65) Prior Publication Data

US 2003/0152118 A1 Aug. 14, 2003

Related U.S. Application Data

(60) Provisional application No. 60/357,070, filed on Feb. 12, 2002.

(51) Int. Cl.[7] .............................. H01S 3/13; H01S 3/00
(52) U.S. Cl. .............................. 372/29.021; 372/29.02; 372/38.01; 372/38.02; 372/38.07
(58) Field of Search ........................ 372/34, 36, 29.02, 372/29.021, 29.022, 29.023, 30–32, 38.01, 38.02, 38.04, 38.07

(56) References Cited

U.S. PATENT DOCUMENTS

| 5,604,758 | A | * | 2/1997 | AuYeung et al. .............. 372/34 |
| 6,526,076 | B2 | * | 2/2003 | Cham et al. ........... 372/29.011 |
| 6,631,146 | B2 | * | 10/2003 | Pontis et al. .................. 372/20 |
| 6,748,181 | B2 | * | 6/2004 | Miki et al. ................... 398/195 |
| 2002/0105982 | A1 | * | 8/2002 | Chin et al. ................ 372/38.02 |
| 2002/0149821 | A1 | | 10/2002 | Aronson et al. |
| 2002/0181519 | A1 | * | 12/2002 | Vilhelmsson et al. ......... 372/32 |

* cited by examiner

*Primary Examiner*—Minsun Oh Harvey
*Assistant Examiner*—James Menefee
(74) *Attorney, Agent, or Firm*—Workman Nydegger

(57) ABSTRACT

A method of maintaining desirable optical performance of an optoelectronic apparatus at extreme temperatures is disclosed. At a first temperature, a first bias current at which the laser generates optical signals at a first level is determined. At a second temperature outside of a predefined range of the first temperature, a second bias current at which the laser generates optical signals at a second level is determined. If the second temperature is greater than the higher end-point temperature of the predefined range, the second predefined level is defined to be less than the first predefined level. If the second temperature is less than the lower end-point temperature of the predefined range, the second predefined range is defined to be greater than the first predefined level.

19 Claims, 16 Drawing Sheets

Temperature Lookup Table 300

| Sensed Temperature Values | Control Values for DC Bias Current | Control Values for AC Current Swing |
|---|---|---|
| ↕ Value = 0 - 255 ↕ | ↕ Value = 0 - 255 ↕ | ↕ Value = 0 - 255 ↕ |

Fig. 8

(Predefined Temperature Range)

(Extreme Temperature With Non-Adjusted Bias)

(Extreme Temperature With Adjusted Bias)

(Laser Type 1)

(Laser Type 2)

(Laser Type 3)

(Target Power Overlay)

MAINTAINING DESIRABLE PERFORMANCE OF OPTICAL EMITTERS AT EXTREME TEMPERATURES

The present application is a continuation-in-part of, and claims priority to, U.S. Provisional Patent Application No. 60/357,070 filed Feb. 12, 2002, which is incorporated herein by reference.

BRIEF DESCRIPTION OF THE INVENTION

The present invention relates generally to the field of fiber optic transceivers and particularly to circuits used within the transceivers to maintain desirable optical performance of optical emitters over temperature variations.

BACKGROUND OF THE INVENTION

FIG. 1 shows a schematic representation of the essential features of a typical prior-art fiber optic transceiver. The main circuit 1 contains at a minimum transmit and receiver circuit paths and power 19 and ground connections 18. The receiver circuit, which takes relatively small signals from an optical detector and amplifies them to create a uniform amplitude digital electronic output, typically consists of a Receiver Optical Subassembly (ROSA) 2 which contains a mechanical fiber receptacle as well as a photodiode and pre-amplifier (preamp) circuit. The ROSA is in turn connected to a post-amplifier (postamp) integrated circuit 4, the function of which is to generate a fixed output swing digital signal which is connected to outside circuitry via the RX+ and RX– pins 17. The postamp circuit also often provides a digital output signal known as Signal-Detect or Loss-of-Signal indicating the presence or absence of suitably strong optical input. The Signal-Detect output is provided as an output on pin 20.

The transmit circuit, which accepts high speed digital data and electrically drives an LED or laser diode to create equivalent optical pulses, typically consists of a Transmitter Optical Subassembly (TOSA) 3 and a laser driver integrated circuit 5. The TOSA contains a mechanical fiber receptacle as well as a laser diode or LED. The laser driver circuit will typically provide AC drive and DC bias current to the laser. The signal inputs for the AC driver are obtained from the TX+ and TX– pins 12. Typically, the laser driver circuitry will require individual factory setup of certain parameters such as the bias current (or output power) level and AC modulation drive to the laser. This is accomplished by adjusting variable resistors or placing factory selected resistors 7, 9 (i.e., having factory selected resistance values). Additionally, temperature compensation of the bias current and modulation is often required because the output power of laser diodes and LEDs can change significantly across a relatively small temperature range.

The prior art fiber optic transceiver of FIG. 1 uses thermistors (e.g., thermistors 6, 8) whose electrical resistance changes as a function of temperature to control the current supplied to the laser diodes. Under high-volume manufacturing conditions, however, the temperature compensation scheme using thermistors is inaccurate due to variations in thermistor characteristics and laser characteristics.

Accordingly, what is needed is a method of maintaining desirable optical power of the optical emitters over temperature variations. What is further needed is a temperature compensation mechanism that is not vulnerable to variations in thermistor characteristics and emitter characteristics.

SUMMARY OF THE INVENTION

The present invention provides a method of maintaining consistent performance of optical emitters (e.g., lasers and LEDs) over a range of temperatures. In one embodiment, the present invention maintains the optical performance of a laser in terms of power and extinction ratio over temperature variations, thereby optimizing jitter, mask margin and general fiber optic transmitter eye quality. Advantageously, the present invention enables the use of inexpensive laser diodes or LEDs, whose optical performance can fluctuate significantly, in fiber optic transceivers.

The present invention is preferably implemented in a fiber optic transceiver having a laser, a laser driver circuit and a single-chip integrated circuit, sometimes called a controller or controller IC. The controller IC includes memory for storing information related to the transceiver. Furthermore, the controller IC includes analog-to-digital conversion circuitry for receiving diagnostic/feedback signals from various components of the transceiver and for converting the diagnostic/feedback signals into digital values. The controller IC also includes memory for storing the digital values in predefined memory mapped locations. The controller IC controls the operation of the laser in accordance with one or more values stored in the memory. A serial interface is provided to enable a host device to read from and write to locations within the memory. A plurality of the control functions and a plurality of the monitoring functions of the controller are exercised by a host computer by accessing corresponding memory mapped locations within the controller. The controller further includes a temperature sensor, which generates a temperature signal corresponding to a temperature of the transceiver, and analog to digital conversion circuitry that is configured to convert the temperature signal into a digital temperature value for storing in a predefined location within the memory.

According to the present invention, a calibration process is carried out for the transceiver during which the performance of the laser is sampled at different temperatures. In particular, the optical output power is monitored while the laser bias current is adjusted for each of the temperatures such that the optical output power remains substantially constant. The appropriate AC current swing at each temperature is also determined. Control values corresponding to the DC bias current and AC current swing used at each temperature are recorded within predefined memory locations within the transceiver, preferably in association within the digital temperature value obtained from the temperature sensor. In one embodiment, the digital temperature values and control values for the DC bias current and the AC current swing are stored in a temperature lookup table.

During operation, the controller uses entries of the temperature lookup table and a currently detected temperature value to determine the control values for the appropriate DC bias current and AC current swing. The controller then provides control signals to the laser driver circuit such that the appropriate DC bias current and AC current swing are supplied to the laser. In this way, changes in the performance of the laser over temperature fluctuations can be accurately compensated.

BRIEF DESCRIPTION OF THE DRAWINGS

Aspects of the present invention will be more readily apparent from the following description and appended claims when taken in conjunction with the accompanying drawings, in which:

FIG. 8 shows a temperature lookup table according to an embodiment of the present invention;

DESCRIPTION OF PREFERRED EMBODIMENTS

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Fiber Optic Transceiver Components

Figure 1:
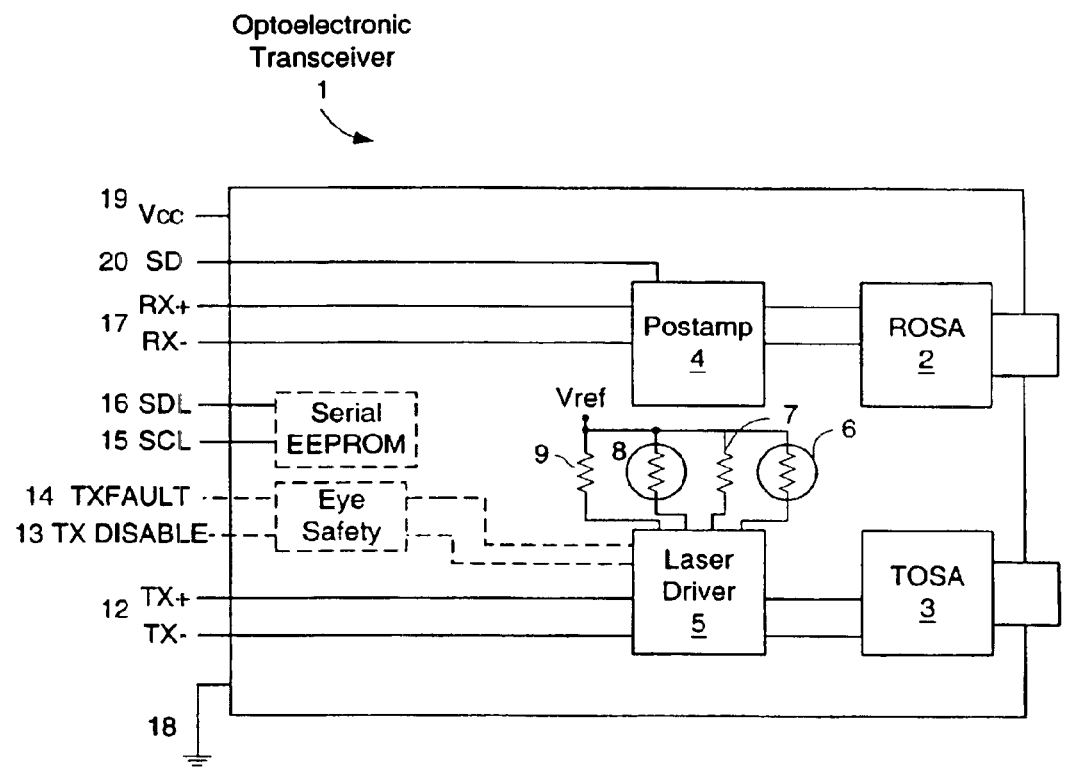
FIG. 1 is a block diagram of a prior art optoelectronic transceiver.
Figure 2:
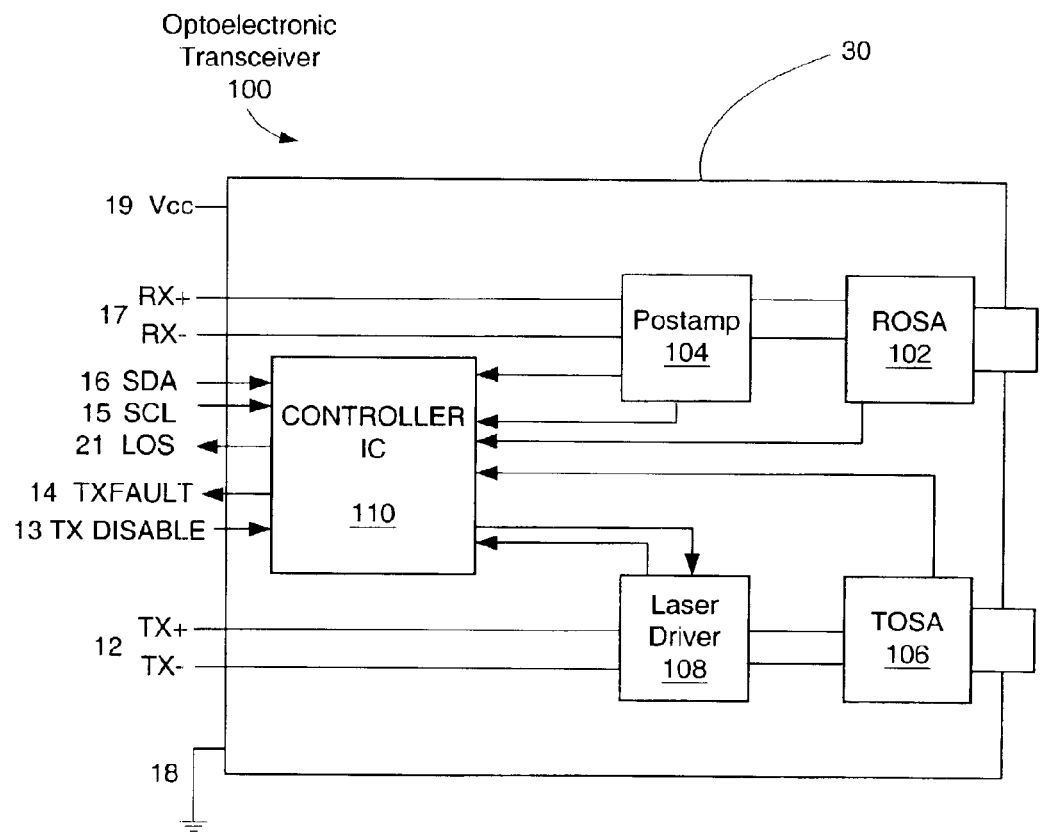
FIG. 2 is a block diagram of an optoelectronic transceiver in accordance with the present invention.
Figure 3:
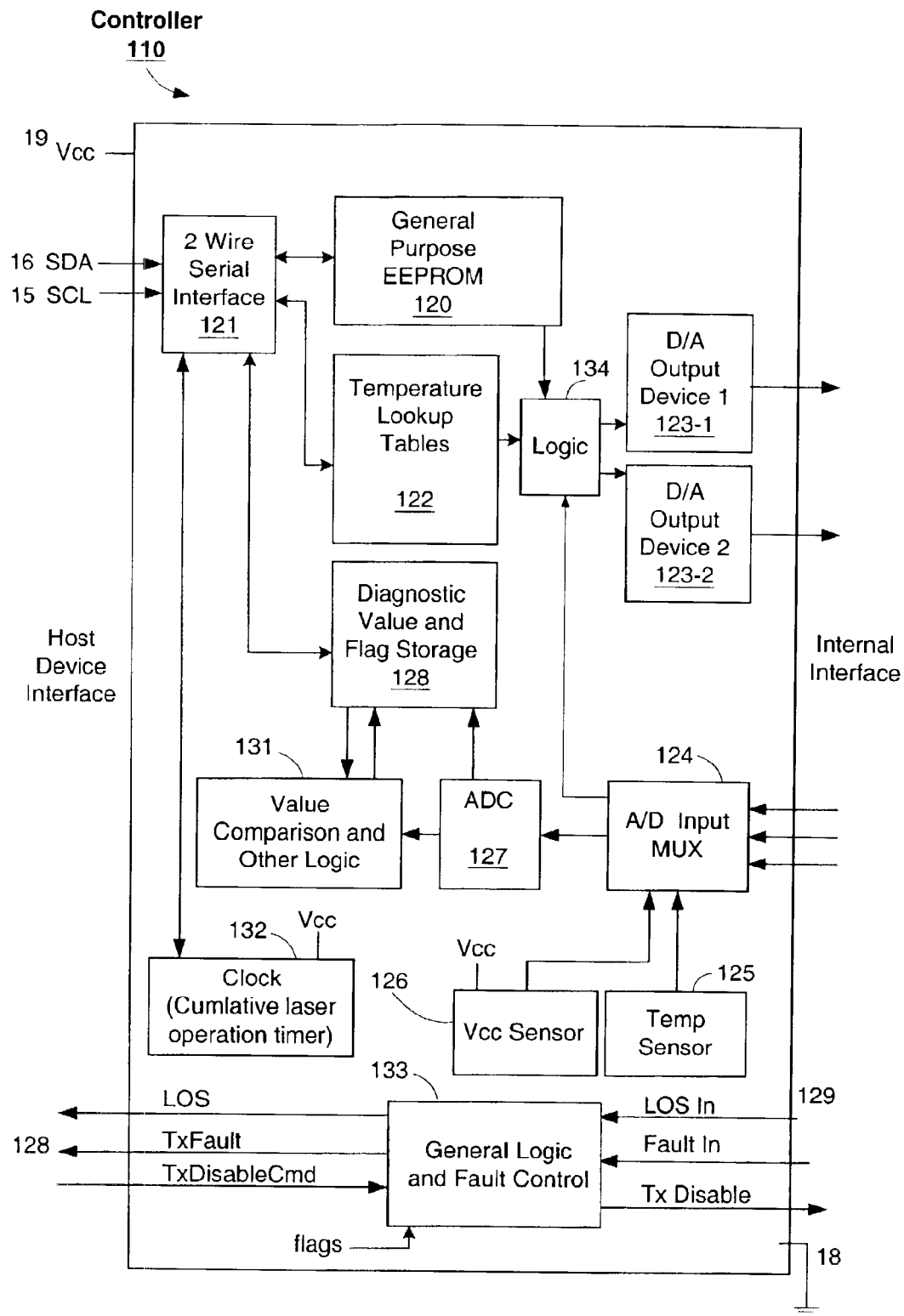
FIG. 3 is a block diagram of modules within the controller of the optoelectronic transceiver of FIG. 2.

A transceiver 100 in which embodiments of the present invention may be practiced is shown in FIGS. 2 and 3. The transceiver 100 contains a Receiver Optical Subassembly (ROSA) 102 and Transmitter Optical Subassembly (TOSA) 106 along with associated post-amplifier 104 and laser driver 108 integrated circuits that communicate the high speed electrical signals to the outside world. Control and setup functions are implemented with a single-chip integrated circuit controller 110, hereinafter controller IC 110 or IC controller 110. An example implementation of the single-chip integrated circuit controller 110 is described in co-pending U.S. Non-Provisional patent application entitled "INTEGRATED MEMORY MAPPED CONTROLLER CIRCUIT FOR FIBER OPTICS TRANSCEIVER," filed Feb. 5, 2001, bearing Ser. No. 09/777,917, and which is hereby incorporated by reference.

The controller IC 110 handles all low speed communications with the end user. These include the standardized pin functions such as Loss-of-Signal (LOS) 21, Transmitter Fault Indication (TX FAULT) 14, and the Transmitter Disable Input (TXDIS) 13. The controller IC 110 has a two wire serial interface 121, also called the memory interface, for reading and writing to memory mapped locations in the controller. Values written to some of the memory mapped locations in the controller are used by its logic circuits to generate control signals for the controller itself and other components of the transceiver. Values written to some of the memory mapped locations in the controller can be read by an external device (e.g., a host computer) via the two wire serial interface 121.

The interface 121 is coupled to host device interface input/output lines, typically clock (SCL) and data (SDA) lines, 15 and 16. In one embodiment, the serial interface 121 operates in accordance with the I$^2$C serial interface standard that is also used in the GBIC and SFP (Small Form Factor Pluggable) standards. Other interfaces could be used in alternate embodiments. The two wire serial interface 121 is used for all setup and querying of the controller IC 110, and enables access to the optoelectronic transceiver's control circuitry as a memory mapped device. That is, tables and parameters are set up by writing values to predefined memory locations of one or more nonvolatile memory devices 120, 122, 128 (e.g., EEPROM devices) in the controller, whereas diagnostic and other output and status values are output by reading predetermined memory locations of the same nonvolatile memory devices 120, 128, 122. This technique is consistent with currently defined serial ID functionality of many transceivers where a two wire serial interface is used to read out identification and capability data stored in an EEPROM. In some transceivers, one or more of the memory devices 120, 122, 128 are volatile memories.

It is noted here that some of the memory locations in the memory devices 120, 122, 128 are dual ported, or even triple ported in some instances. That is, while these memory mapped locations can be read and in some cases written via the serial interface 121, they are also directly accessed by other circuitry in the controller IC 110. For instance, there are flags stored in memory 128 that are (A) written by logic circuit 131, and (B) read directly by logic circuit 133. An example of a memory mapped location not in memory devices but that is effectively dual ported is the output or result register of clock 132. In this case the accumulated time value in the register is readable via the serial interface 121, but is written by circuitry in the clock circuit 132. In accordance with the present invention, certain "margining" values stored in memory 120 are read and used directly by logic 134 to adjust (i.e., scale upwards or downwards) drive level signals being sent to the D/A output devices 123.

In addition to the result register of the clock 132, other memory mapped locations in the controller may be implemented as registers at the input or output of respective sub-circuits of the controller. For instance, the margining values used to control the operation of logic 134 may be stored in registers in or near logic 134 instead of being stored within memory device 128.

As shown in FIGS. 2 and 3, the controller IC 110 has connections to the laser driver 108 and receiver components. These connections serve multiple functions. The controller IC 110 has a multiplicity of D/A converters 123. In one embodiment the D/A converters are implemented as current sources, but in other embodiments the D/A converters may be implemented using voltage sources, and in yet other embodiments the D/A converters may be implemented using digital potentiometers. In some embodiments, the output signals of the D/A converters are used to control key parameters of the laser driver circuit 108. In one embodiment, outputs of the D/A converters 123 are used to directly control the laser bias current as well as to control the AC modulation level to the laser (constant bias operation). In another embodiment, the outputs of the D/A converters 123 of the controller IC 110 control the level of average output power of the laser driver 108 in addition to the AC modulation level (constant power operation).

According to one embodiment of the invention, the controller IC 110 includes mechanisms to compensate for temperature dependent characteristics of the laser. These mechanisms are implemented in the controller IC 110 through the use of temperature lookup tables stored in memory devices (e.g., memory 122) of the transceiver. The entries in the temperature lookup tables are used by logic circuits of the controller IC to assign appropriate values to the D/A converters 123. The D/A converters 123 in turn provide control output signals to the laser driver circuit so as to control the bias current and current swing that the laser driver circuit generates.

In this embodiment, the controller IC 110 uses D/A converters to generate analog signals for controlling the laser driver 108. In other embodiments, digital potentiometers are used in place of D/A converters. It should also be noted that while FIG. 2 refers to a system where the laser driver 108 is specifically designed to accept analog inputs from the controller IC 110, it is possible to modify the controller IC 110 such that it is compatible with laser driver ICs with digital inputs.

In addition to the connection from the controller IC 110 to the laser driver 108, FIG. 2 shows a number of connections from the laser driver 108 to the controller IC 110, as well as similar connections from the ROSA 106 and Postamp 104 to the controller IC 110. These are monitoring connections that the controller IC 110 uses to receive diagnostic feedback information from the transceiver components. In one embodiment, the diagnostic feedback information is stored in the memory mapped locations in the controller IC such that the information is accessible by the host device via memory reads. In some embodiments, the controller IC 110 receives diagnostic feedback information from the TOSA 106 and stores such information in the controller IC, but such connections are not shown in FIG. 2.

The controller IC 110 in one embodiment has a multiplicity of analog inputs. The analog input signals indicate operating conditions (e.g., receiver laser power, DC bias current, AC current swing) of the transceiver and/or receiver circuitry. These analog signals are scanned by a multiplexer 124 and converted using an analog to digital (A/D) converter 127. The A/D converter 127 has 12 bit resolution in one embodiment, and A/D converters with other resolution levels may be used in other embodiments. The converted values are stored in predefined memory locations, for instance in the diagnostic value and flag storage device 128 shown in FIG. 3, and are accessible to the host device via memory reads. These values are calibrated to standard units (such as millivolts or microwatts) as part of a factory calibration procedure.

In one embodiment, a temperature sensor 125, which is shown in FIG. 3, measures a temperature of the transceiver and generates an analog temperature signal. The analog temperature signal is scanned by the multiplexer 124 and converted using the A/D converter 127. The converted values are stored in predefined memory locations for access by the host device via memory reads. In other embodiments, a temperature sensor that is disposed within the TOSA 106 is used to provide a more accurate measurement of the laser's temperature.

The digitized quantities stored in memory mapped locations within the controller IC are not limited to digital temperature values. The quantities stored in the memory mapped locations include, but are not limited to, control values representative of DC bias current, AC current swing, transmitted laser power, received power as well as corresponding flag values and configuration values (e.g., for indicating the polarity of the flags).

Also shown in FIG. 3 is a voltage supply sensor 126. An analog voltage level signal generated by this sensor is converted to a digital voltage level signal by the A/D converter 127, and the digital voltage level signal is stored in memory 128. In one embodiment, the analog to digital input mux 124 and A/D converter 127 are controlled by a clock signal so as to automatically, periodically convert the monitored signals into digital signals, and to store those digital values in memory 128.

Controlling Laser Performance Over Temperature Variations

Figure 4:
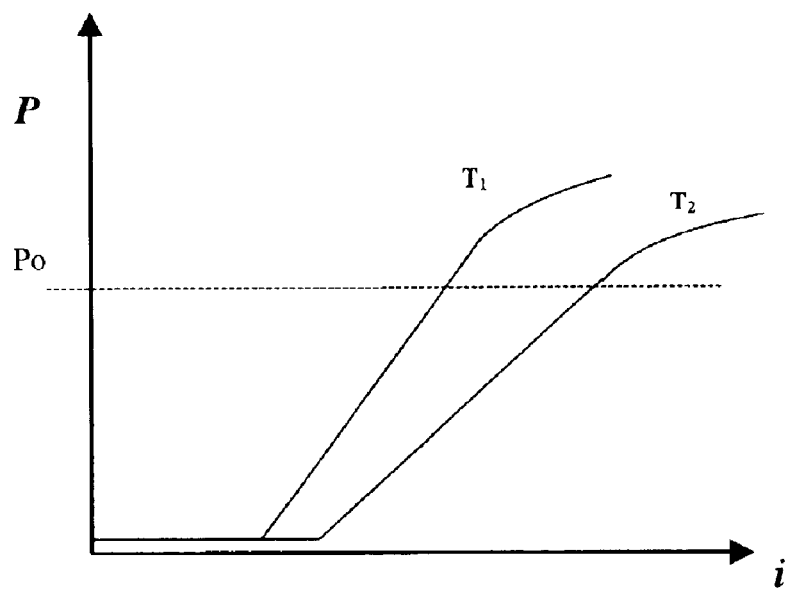
FIG. 4 show two L-i curves illustrating a relationship between optical output power, laser bias current and temperature of a laser emitter.

FIG. 4 illustrates a relationship among optical output power (L), laser bias current (i) of a laser and its operating temperature (T). This type of graph is sometimes known as an L-i curve. At any temperature, the laser bias current must exceed a certain threshold for the laser to emit light. The threshold value is different for each temperature. Further, the threshold value varies from diode to diode. Also note that the slope efficiency of a laser (i.e., the change in optical output power divided by the change in laser driver current) changes over temperature. The slope efficiency of one laser is also different from another laser. That is, a laser's sensitivity to current modulation varies from one laser to another at the same temperature and the same bias level. The rate slope efficiency changes over temperature can also vary. For example, the slope efficiency of one laser can drop by 5% going from 25° C. to 35° C., and the slope efficiency of another laser can drop by 10% with the same change in temperature. With so many variables, it is difficult to accurately compensate for a laser's temperature-dependent characteristics with a thermistor as in the prior art.

The present invention provides for a mechanism that compensates for the temperature-dependent characteristics of a laser. This temperature compensation mechanism does not use thermistors for adjusting the bias current of the laser. Rather, accurate temperature compensation is achieved through the use of temperature lookup tables that correlate temperature with appropriate control signals for the laser driver circuit 108. The present invention also provides for a calibration method that determines the appropriate values to be stored in the temperature lookup tables such that accurate and consistent laser performance over different temperatures can be achieved.

Some of the steps of one calibration method of the present invention are described below in Table 1, and some of the steps of another calibration method of the present invention are described below in Table 2. Some of the steps described are performed sequentially and one at a time. In other embodiments, some of the steps are performed out of sequence, and some of the steps are performed simultaneously. Some portions of some of the steps may be omitted in some embodiments. The steps described below are discussed with specific references to the transceiver 100. It should be noted, however, that the calibration method is applicable to other fiber optic devices as well.

Table 1

Step (1)

An optoelectronic transceiver 100 is hooked up to an optical oscilloscope and a test computer system 804, which can be a computer system running test software. In this step, appropriate control values are written to various memory mapped locations of the controller IC 110 so as to adjust the DC bias current and AC current swing of the laser until a desired optical output signal is observed on the optical oscilloscope. The desired optical signal should have an optical power and an extinction ratio (ER) that meet certain industry standards (e.g., eye safety standards, etc.). A typical desirable extinction ratio, which is the ratio of the maximum and minimum laser output power levels generated by a laser emitter of the transceiver, is 9 dB. When the desired optical output signal is generated, the value of the DC bias current and the AC current swing are recorded in the controller IC 110, in a memory of the transceiver, or in the test computer system 804. This step (1), which is illustrated in FIG. 5, is referred to herein as ER-SETUP.

Figure 5:
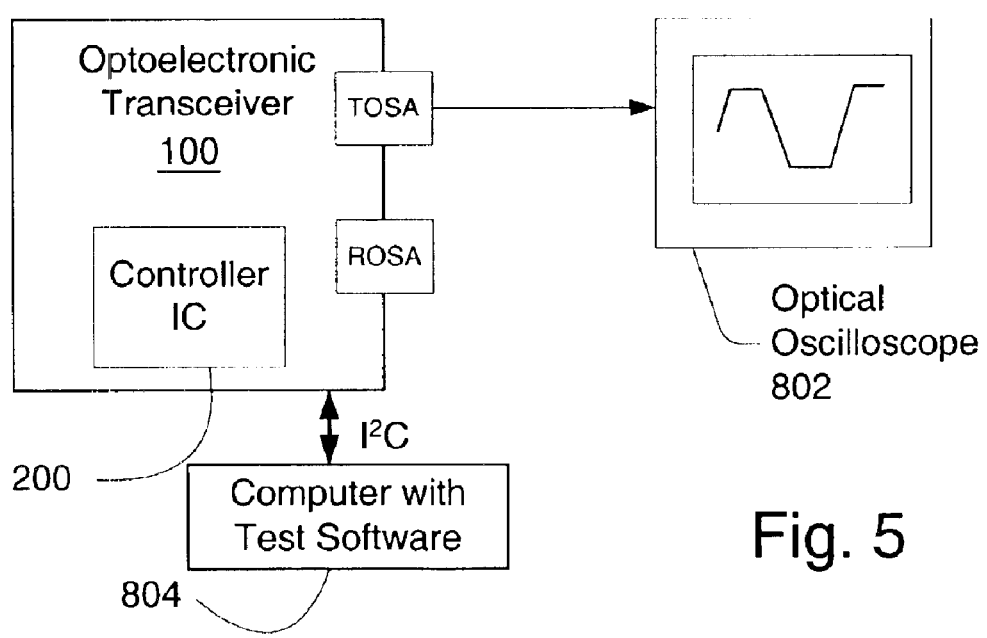
FIG. 5 depicts a transceiver undergoing a transmitter calibration step that is part of an embodiment of the present invention.

As shown in FIG. 5, the test computer system 804 provides the necessary control signals to the optoelectronic transceiver 100 via an I²C interface during ER-SETUP. In this step, for example, control values for adjusting the DC bias current and AC current swing, as well as control signals to read values from and write values to memory mapped locations of the transceiver, are transmitted from the test computer system 804 to the controller IC 110 via the I²C interface and written to appropriate memory mapped locations. After ER-SETUP, the transceiver 100 is unhooked from the optical oscilloscope.

Step (2a)

Figure 6:
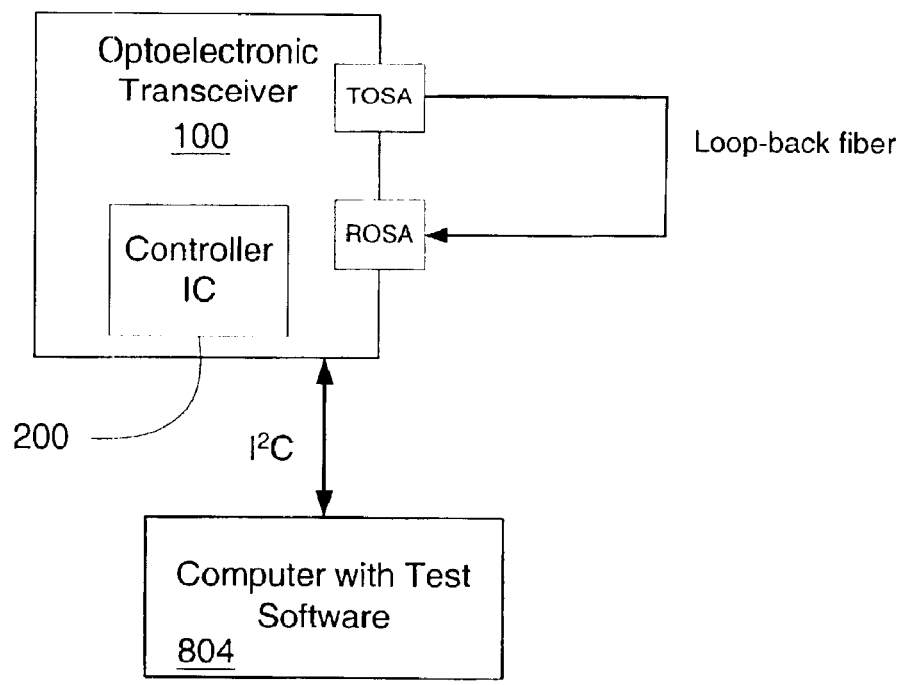
FIG. 6 depicts a transceiver undergoing receiver calibration step that is part of an embodiment of the present invention.

According to one embodiment, after ER-SETUP, the TOSA 106 of the transceiver 100 is connected to its ROSA 102 by an optical fiber to create a loop-back. The transceiver is then turned-on for a few minutes to let the transceiver adjust to a stable operating condition. A loop-back fiber connecting the TOSA 106 and ROSA 102 of the transceiver 100 is shown in FIG. 6. The optical power received and measured by the receiver circuit(s) of the transceiver 100 is herein referred to as the Loopback-Rx-Power (LRP). In this embodiment, a value representative of the current LRP is frequently written to a memory mapped location within the controller IC 110 where the value can be accessed by the test computer system 804 via the I²C interface.

Step (2b)

In one embodiment, the TOSA of the transceiver 100 is equipped with a photo-diode that is positioned to sense the intensity of the optical signals emitted by the laser. The photo-diode is sometimes called a "back-monitoring photo-diode," as it detects light reflected from the laser package that encloses the laser. In this embodiment, a loop-back fiber connecting the TOSA and ROSA is not necessary, since the optical power of the laser can be measured by the back-monitoring photo-diode. For simplicity, the optical power measured by the back-monitoring photo-diode is also called Loopback-Rx-Power herein. A value representative of the power received by the photo-diode is written to a memory mapped location of the controller IC 110. This value can then be read by the test computer system 804 via the I²C interface. Step (2b) is particularly useful when determining the power of the optical signals emitted by an optoelectronic transmitter, which does not have a receiver subassembly or receiver circuitry.

Step (3)

In this step, the transceiver 100 is placed in a temperature controlled environment (e.g., an oven). The temperature of the environment is set to a value that is similar to that at which the ER-SETUP is performed. For example, the temperature of the controlled environment is set to 25° C. in this step.

Step (4)

The DC bias current value ($LDI_{p25}$) obtained at ER-SETUP is written to a predetermined memory mapped location of the controller IC 110 to set the DC bias current of the laser. When the DC bias current of the laser is set, the Loopback-Rx-Power (LRP) is measured. A value representative of the measured Loopback-Rx-Power, $LRP_{p25}$, is stored in another predetermined memory mapped location of the controller IC 110 where it can be accessed by the test computer system 804 via the I²C interface. As mentioned, the LRP can be obtained from receiver circuits of a ROSA or from a back-monitoring photodiode.

Step (5)

The Loopback-Rx-Power (LRP) is determined at two DC bias currents around the DC bias current value obtained at ER-SETUP. In one embodiment, the two DC bias currents are 2 mA apart. This step entails writing appropriate control values to the appropriate memory mapped locations of the controller IC 110 to adjust the bias current of the laser. This step also entails reading the appropriate memory mapped locations for values of the Loopback-Rx-Power after the DC bias current is adjusted. Two data points on an L-i curve of the transceiver are obtained as a result.

Step (6)

Calculations are performed to provide an estimate of the threshold bias current of the laser. In one embodiment, it is assumed that the optical output power of the laser varies linearly with the laser current if the current is over the threshold level. And, it is assumed that the optical output power equals zero if the laser current is at a below the threshold level. Under, these assumptions, these calculations are simplified significantly.

Figure 7A:
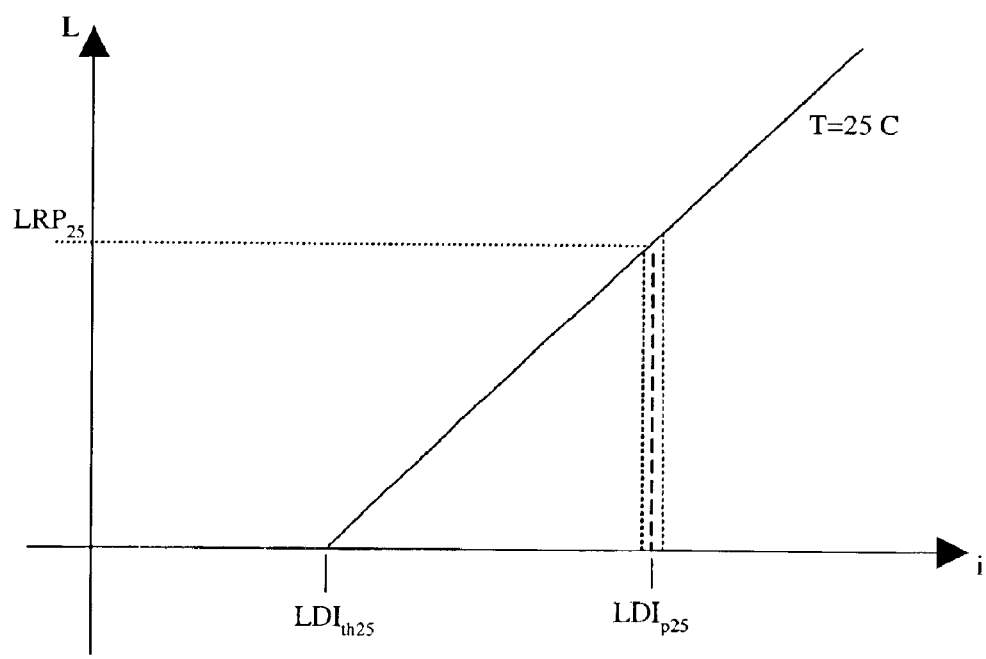
FIG. 7A depicts a calculation step according to an embodiment of the present invention.

The calculations are graphically illustrated in FIG. 7A. Two data points obtained at step (5) are shown. A straight line connecting the two data points is extrapolated to determine an x-intercept of the line. The intercept value, $LDI_{th25}$, is then stored in the test computer system 804. The DC bias current ($LDI_{p25}$), the measured Loopback-Rx-Power ($LRP_{p25}$), the x-intercept ($LDI_{th25}$) and the extrapolated line are also depicted in FIG. 7A. Preferably, the calculations are performed by the test computer system 804.

Step (7)

In this step, after the DC bias current is set, the controller IC 110 writes the AC current swing control value ($AC_{25}$) obtained at ER-SETUP to a predetermined memory mapped location to set the AC current swing of the laser. This step can be performed before step (4).

Step (8)

In this step, the controller IC 110 obtains a temperature value from a temperature sensor 125 that is internal to the controller IC 110. In other embodiments, the temperature value is obtained from a temperature sensor that is external to the controller IC 110. Although the actual temperature (e.g., 25° C.) is known, this step is performed because the value generated by the temperature sensor is needed.

Step (9)

In this step, the temperature value obtained at step (8) and values corresponding to the DC bias current ($LDI_{p25}$) and the AC current swing ($AC_{25}$) are stored in a temperature lookup table of the controller IC 110. In one embodiment, the stored values are integer values ranging from 0–255.

Step (10)

After the parameter values for T=25° C. are stored, the temperature of the environment is set to another value (e.g., 35° C.).

Step (11)

Figure 7B:
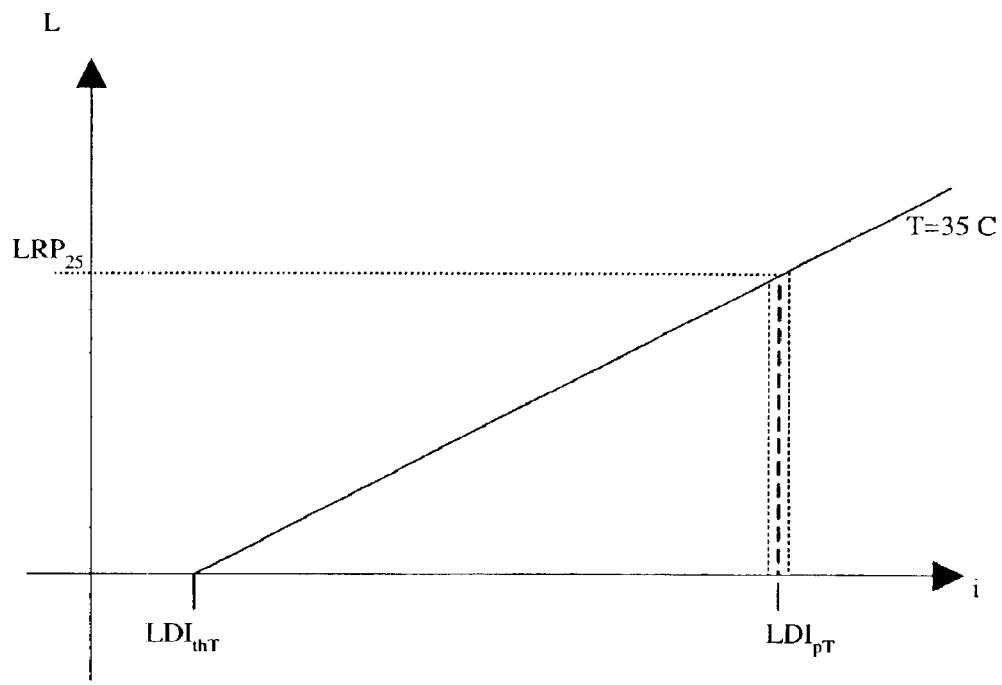
FIG. 7B depicts another calculation step according to an embodiment of the present invention.

When monitoring the LRP by reading memory mapped location(s) of the controller IC, the test computer system 804 writes control values to memory mapped locations of the controller IC 110 to adjust the DC bias current until the Loopback-Rx-Power reaches $LRP_{p25}$. When the LRP reaches $LRP_{p25}$, the DC bias current $LDI_{pT}$ applied to achieve this output power is recorded, preferably at a predetermined memory mapped location of the controller IC. This DC bias current $LDI_{pT}$ is depicted in FIG. 7B.

Step (12)

The Loopback-Rx-Power (LRP) at two DC bias currents around the DC bias current $LDI_{pT}$ obtained in step (11) is measured. In one embodiment, the two DC bias currents are 2 mA apart. This step entails writing appropriate control values to predetermined memory mapped locations of the controller IC 110 to adjust the DC bias current of the laser. This step also entails reading the appropriate memory mapped locations for the values of the Loopback-Rx-Power after the DC bias current is adjusted. In one embodiment, the controller IC is obtained from the receiver circuitry of the transceiver. In another embodiment, the LRP is obtained from the back-monitoring photodiode of the TOSA. Two data points on L-i curve associated with the new temperature are obtained as a result of this step.

Step (13)

In this step, calculations are performed to provide an estimate of the threshold bias current of a laser at this new temperature (e.g. 35° C.).

The calculations steps are graphically represented in FIG. 7B. Two data points obtained from step (12) are shown. A straight line connecting the two data points is extrapolated to determine its x-intercept. The x-intercept value, $LD1_{thT}$, is then stored in the test computer system 804. The DC bias current ($LD1_{pT}$), the measured Loopback-Rx-Power ($LRP_{pT}$), the x-intercept ($LD1_{thT}$) and the extrapolated line, all of which are related to this temperature 7, are also illustrated in FIG. 7B. In one embodiment, this step is preferably performed by test computer system 804.

Step (14)

Figure 7C:
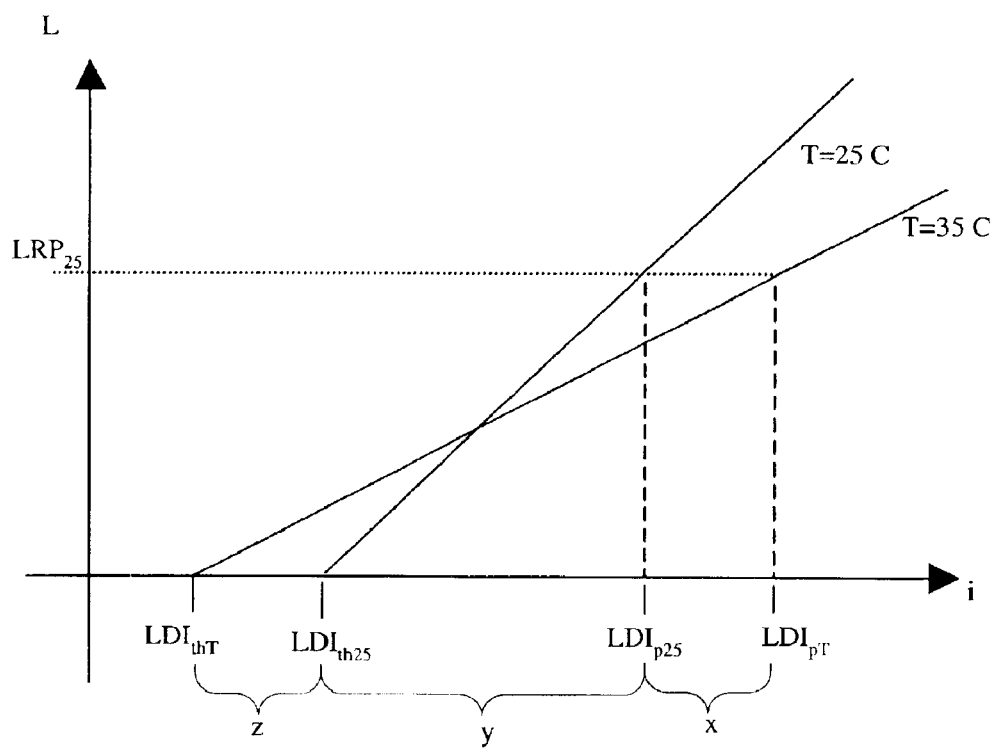
FIG. 7C depicts yet another calculation step according to an embodiment of the present invention.

In this step, an estimate of the AC current swing, $AC_T$, at the current temperature is calculated with the following formula: $AC_T = AC_{25} * [1 + (X+Z)/Y]$, where $X = LDI_{pT-LDIp25}$, $Y = LDI_{p25} - LDI_{th25}$, and $Z = LDI_{th25} - LDI_{thT}$. The correlations between the values X, Y, Z and the L-i curves of a transceiver are shown in FIG. 7C. This step is preferably performed by the test computer system 804.

Step (15)

In this step, the controller IC 110 obtains a temperature value from the temperature sensor.

Step (16)

The controller IC 110 then stores the temperature value obtained at step (15) in association with control values for the DC bias current ($LDI_{pT}$) and the AC current swing ($AC_T$) in the temperature lookup tables. In the present embodiment, actual current values are not stored. Rather, the values stored are integer values ranging from 0–255.

Step (17)

Steps (10)–(16) are preferably repeated for multiple temperatures within a predetermined operating range (e.g., 0° C.–60° C. at 5° C. increments).

Step (18)

Additional DC bias current values can be obtained by interpolating/extrapolating values obtained in step (17). The interpolated/extrapolated values are also stored in the temperature lookup tables. In some embodiments, this step is optional.

Step (19)

The transceiver 100 is unhooked from the test computer system 804.

Table 2

Step (21)

An optoelectronic transceiver 100 is hooked up to an optical oscilloscope and a test computer system 804, which can be a computer system running test software. In this step, appropriate control values are written to various memory mapped locations of the controller IC 110 so as to adjust the DC bias current and AC current swing of the laser until a desired optical output signal is observed on the optical oscilloscope. The desired optical signal should have an optical power and an extinction ratio (ER) that meet certain industry standards (e.g., eye safety standards, etc.). A typical desirable extinction ratio, which is the ratio of the maximum and minimum laser output power levels generated by a laser emitter of the transceiver, is 9 dB. When the desired optical output signal is generated, the value of the DC bias current and the AC current swing are recorded in the controller IC 110, in a memory of the transceiver, or in the test computer system 804. This step (21), which is illustrated in FIG. 5, is referred to herein as ER-SETUP.

As shown in FIG. 5, the test computer system 804 provides the necessary control signals to the optoelectronic transceiver 100 via an I²C interface during ER-SETUP. In this step, for example, control values for adjusting the DC bias current and AC current swing, as well as control signals to read values from and write values to memory mapped locations of the transceiver, are transmitted from the test computer system 804 to the controller IC 110 via the I²C interface and written to appropriate memory mapped locations. After ER-SETUP, the transceiver 100 is unhooked from the optical oscilloscope.

Step (22a)

According to one embodiment, after ER-SETUP, the TOSA 106 of the transceiver 100 is connected to its ROSA 102 by an optical fiber to create a loop-back. The transceiver is then turned-on for a few minutes to let the transceiver adjust to a stable operating condition. A loop-back fiber connecting the TOSA 106 and ROSA 102 of the transceiver 100 is shown in FIG. 6. The optical power received and measured by the receiver circuit(s) of the transceiver 100 is herein referred to as the Loopback-Rx-Power (LRP). In this embodiment, a value representative of the current LRP is frequently written to a memory mapped location within the controller IC 110 where the value can be accessed by the test computer system 804 via the I²C interface.

Step (22b)

In one embodiment, the TOSA of the transceiver 100 is equipped with a photo-diode that is positioned to sense the intensity of the optical signals emitted by the laser. The photo-diode is sometimes called a "back-monitoring photo-diode," as it detects light reflected from the laser package that encloses the laser. In this embodiment, a loop-back fiber connecting the TOSA and ROSA is not necessary, since the optical power of the laser can be measured by the back-monitoring photo-diode. For simplicity, the optical power measured by the back-monitoring photo-diode is also called Loopback-Rx-Power herein. A value representative of the power received by the back-monitoring photo-diode is written to a memory mapped location of the controller IC 110. This value can then be read by the test computer system 804 via the I$^2$C interface. Step (22b) is particularly useful when determining the power of the optical signals emitted by an optoelectronic transmitter, which does not have a receiver subassembly or receiver circuitry.

Step (23)

In this step, the transceiver 100 is placed in a temperature controlled environment (e.g., an oven). The temperature of the environment is set to a value that is similar to that at which the ER-SETUP is performed. For example, the temperature of the controlled environment is set to 25° C. in this step.

Step (24)

The DC bias current value ($LDI_{p25}$) obtained at ER-SETUP is written to a predetermined memory mapped location of the controller IC 110 to set the DC bias current of the laser. When the DC bias current of the laser is set, the Loopback-Rx-Power (LRP) is measured. A value representative of the measured Loopback-Rx-Power, $LRP_{p25}$, is stored in another predetermined memory mapped location of the controller IC 110 where it can be accessed by the test computer system 804 via the I$^2$C interface. As mentioned, the LRP can be obtained from receiver circuits of a ROSA or from a back-monitoring photodiode.

Step (25)

The Loopback-Rx-Power (LRP) is determined at two DC bias currents around the DC bias current value obtained at ER-SETUP. In one embodiment, the two DC bias currents are 2 mA apart. This step entails writing appropriate control values to the appropriate memory mapped locations of the controller IC 110 to adjust the bias current of the laser. This step also entails reading the appropriate memory mapped locations for values of the Loopback-Rx-Power after the DC bias current is adjusted. Two data points on an L-i curve ($LRP1_{p25}$, $LDI1_{p25}$) and ($LRP2_{p25}$, $LDI2_{p25}$) are obtained as a result.

Step (26)

Calculations are performed to determine the slope efficiency (SE) of the laser at T=25° C. and at DC bias current of $LDI_{p25}$. In one embodiment, the Slope Efficiency at T=25° C. ($SE_{p25}$) is calculated by [($LRP1_{p25}$–$LRP2_{p25}$)/($LDI1_{p25}$–$LDI2_{p25}$)], $LRP1_{p25}$, $LDI1_{p25}$ $LRP2_{p25}$, and $LDI2_{p25}$ are obtained from step (25). Preferably, the calculations are performed by the test computer system 804. The value of $SE_{p25}$ is preferably stored within the test computer system 804.

Step (27)

In this step, after the DC bias current is set, the controller IC 110 writes the AC current swing control value ($AC_{25}$) obtained at ER-SETUP to a predetermined memory mapped location to set the AC current swing of the laser. This step can be performed before step (24).

Step (28)

In this step, the controller IC 110 obtains a temperature value from a temperature sensor 125 that is internal to the controller IC 110. In other embodiments, the temperature value is obtained from a temperature sensor that is external to the controller IC 110. Although the actual temperature (e.g., 25° C.) is known, this step is performed because the value generated by the temperature sensor is needed.

Step (29)

In this step, the temperature value obtained at step (28) and values corresponding to the DC bias current ($LDI_{p25}$) and the AC current swing ($AC_{25}$) are stored in a temperature lookup table of the controller IC 110. In one embodiment, the stored values are integer values ranging from 0–255.

Step (30)

After the parameter values for T=25° C. are stored, the temperature of the environment is set to another value (e.g., 35° C.).

Step (31)

When monitoring the LRP by reading memory mapped location(s) of the controller IC, the test computer system 804 writes control values to memory mapped locations of the controller IC 110 to adjust the DC bias current until the Loopback-Rx-Power reaches $LRP_{p25}$. When the LRP reaches $LRP_{p25}$, the DC bias current $LDI_{pT}$ applied to achieve this output power is recorded, preferably at a predetermined memory mapped location of the controller IC.

Step (32)

The Loopback-Rx-Power (LRP) at two DC bias currents around the DC bias current $LDI_{pT}$ obtained in step (31) is measured. In one embodiment, the two DC bias currents are 2 mA apart. This step entails writing appropriate control values to predetermined memory mapped locations of the controller IC 110 to adjust the DC bias current of the laser. This step also entails reading the appropriate memory mapped locations for the values of the Loopback-Rx-Power after the DC bias current is adjusted. In one embodiment, the controller IC is obtained from the receiver circuitry of the transceiver. In another embodiment, the LRP is obtained from the back-monitoring photodiode of the TOSA. Two data points on L-i curve associated with the new temperature, ($LRP1_{pT}$, $LDI1_{pT}$) and ($LRP2_{pT}$, $LDI2_{pT}$) are obtained as a result of this step.

Step (33)

Calculations are performed to determine a Slope Efficiency ($SE_{pT}$) of the laser at this new temperature and at DC bias current of $LDI_{pT}$. In one embodiment, the Slope Efficiency at this temperature ($SE_{pT}$) is calculated by [($LRP1_{pT}$–$LRP2_{pT}$)/($LDI1_{pT}$–$LDI2_{pT}$)], where $LRP1_{pT}$, $LDI1_{pT}$ $LRP2_{pT}$, and $LDI2_{pT}$ are obtained from step (32). Preferably, the calculations are performed by the test computer system 804. The value of $SE_{pT}$ is preferably stored within the test computer system 804.

Step (34)

In this step, an estimate of the AC current swing, $AC_T$, at the current temperature is calculated with the following formula: $AC_T = k \ast AC_{25} \ast (SE_{p25}/SE_{pT})$, where $k = LRP_{pT}/LRP_{p25}$. This step is preferably performed by the test computer system 804.

At most temperatures within a normal operational range, $LRP_{pT}$ and $LRP_{p25}$ are equivalent, and k equals 1. At some temperatures, however, the driver circuits of the transceiver 100 may not be able to provide sufficient bias current to the laser to produce the necessary light output power. At those temperatures, the AC current swing is proportionally scaled down so as to maintain a substantially constant extinction ratio.

Step (35)

In this step, the controller IC 110 obtains a temperature value from the temperature sensor.

Step (36)

The controller IC 110 then stores the temperature value obtained at step (35) in association with control values for the DC bias current ($LDI_{pT}$) and the AC current swing ($AC_T$)

in the temperature lookup tables. In the present embodiment, actual current values are not stored. Rather, the values stored are integer values ranging from 0–255.

Step (37)

Steps (30)–(36) are preferably repeated for multiple temperatures within a predetermined operating range (e.g., 0° C.–60° C. at 5° C. increments).

Step (38)

Additional DC bias current values can be obtained by interpolating/extrapolating values obtained in step (37). The interpolated/extrapolated values are also stored in the temperature lookup tables. In some embodiments, this step is optional.

Step (39)

The transceiver 100 is unhooked from the test computer system 804.

FIG. 8 is a block diagram showing a temperature lookup table 300, the entries of which are determined during calibration of the transceiver 100. The temperature lookup table 300, as shown, has multiple entries correlating a temperature value with control values for setting the DC bias current and the AC current swing. Note that the actual temperature values, the actual DC bias current values and the actual AC current swing values are not stored in the table 300. Rather, in the specific embodiment shown, the stored values are integer values ranging from 0–255.

During operation of the transceiver, an analog signal from the temperature sensor is received by the controller IC 110 and converted to a digital temperature value. The digital temperature value is then stored in the memory devices (e.g., General Purpose EEPROM 120). Then, logic in the controller IC 110 determines control values for the laser driver circuit 108 based on the digital temperature value and the entries of the temperature lookup table. These control values are then used by the logic circuits of the controller IC 110 to generate appropriate control signals to cause the laser driver circuit 108 to generate appropriate DC bias currents and AC current swings for the laser.

In accordance with one embodiment of the present invention, when control values for various temperatures are stored within the temperature lookup table 300, the appropriate DC current bias value and AC current swing value at any instantaneous temperature can be interpolated/extrapolated from the stored values. In this way, the laser will behave consistently regardless of temperature fluctuations.

Controlling Laser Performance at Extreme Temperatures

While the techniques described above ensure that a laser operates at a constant power and extinction ratio over all temperatures, it has been shown experimentally that the performance of the laser (as measured by mask margin, rise/fall time, etc.) at constant levels is not necessarily optimal at all conditions. For example, maintaining constant laser performance for 850 nm oxide VCSEL lasers by maintaining constant power and extinction ratio was proven to be impossible over an extended operating temperature range. The current industry-standard temperature range is −10 deg Celsius to +85 deg Celsius. However, extended operating temperature ranges can be as broad as −25 deg Celsius to +90 deg Celsius, or −40 deg Celsius to +95 deg Celsius.

One of the principal difficulties in operating a laser at extreme temperatures is that it can become impossible to operate the laser within the allowable module power levels, while still meeting the TOSA specification for maximum bias current ($I_{max}$) and minimum current necessary to meet the $K_{min}$ limit. The $K_{min}$ limit is a minimum current that ensures that the laser is biased at some multiple above the threshold current to generate adequate laser performance, and is related to the DC bias current (LDI) as follows: $LDI = I_{th}(1 + K_{min})$. The $I_{max}$ limit is the maximum current allowable to ensure laser reliability. In general, the $I_{max}$ and $K_{min}$ values are set by the laser manufacturer.

There are several effects of temperature on laser performance. The principal effect is on the slope efficiency of the laser. At the extreme ends of the operating temperature ranges, the efficiency of a laser can dramatically increase or decrease. Recall that the slope efficiency of the laser is the change in optical output power divided by the change in laser driver current, and that this value changes over temperature as well as between different lasers. At high extreme temperatures (e.g., temperatures greater than 70 deg Celsius), the slope efficiency of a laser may become less (i.e., shallow, or less steep) relative to normal operating temperatures. In other words, the amount of current required to generate the same laser output increases with temperature. Correspondingly, as the temperature decreases, the slope efficiency of the laser may become much greater, or steeper. Thus, it requires less current to generate the same laser output.

Figure 9:
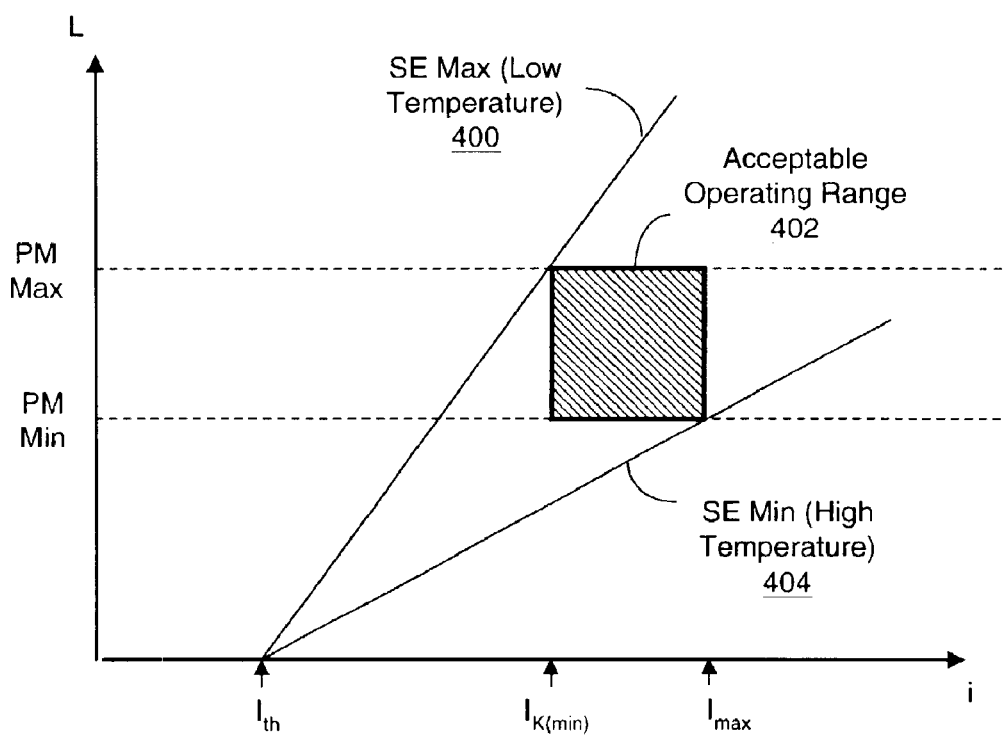
FIG. 9 shows a graph defining TOSA specifications for normal operating temperatures.

To better understand the effects of temperature on slope efficiency, as well as on $K_{min}$ and $I_{max}$, it is helpful to understand how the specification for a TOSA is generated. Referring to FIG. 9, a graph correlating these values is shown. The y-axis of the graph represents power output (L), while the x-axis depicts bias current (I). The PM Max and PM Min values are the maximum and minimum power values for the module that contains the TOSA. The limits on PM Max and PM Min are generally set by the manufacturer, or by industry specification.

The slope efficiencies shown (SE Max 400 and SE Min 404) define a range of slope efficiencies that would be acceptable for a particular laser type, within a predefined range of operating temperatures (e.g., 10 deg Celsius to 70 deg Celsius). The SE Max 400 and SE Min 404 values are calculated as follows. First, at the high-end of the temperature range (e.g., 70 deg Celsius), a maximum and a minimum slope efficiency are calculated, and then translated into room temperature. Then, at the low-end of the temperature range (e.g., 10 deg Celsius), another set of maximum and minimum slope efficiencies are calculated, and also translated into room temperature. Then, from the arrays of slope efficiencies now converted to room temperature, the innermost overlapping areas of slope efficiency are selected, because only a TOSA with these slope efficiencies would satisfy, e.g., both the 10 deg Celsius and the 70 deg Celsius requirements. (This would be, in all likelihood, the maximum slope efficiency at high temperature, and the minimum slope efficiency at low temperature).

Thus, the SE Max 400 and SE Min 404 shown in FIG. 9 are these innermost overlapping areas of slope efficiency that satisfy both the optical power limits (PM Max and PM Min) and the bias current limits ($I_{K(min)}$ and $I_{max}$). From these maximum- and minimum-allowable slope efficiencies, the TOSA power specification at room temperature is set for the production process.

There are two key features of this model. First, at $I_{max}$, the TOSA power will never be lower than the minimum module power, because the minimum slope efficiency cut-off at SE Min 404 ensures that an input bias current of $I_{max}$ will always result in a power output at least equal to PM Min. For slope efficiencies falling between SE Max 400 and SE Min 404, an input bias current of $I_{max}$ may result in an output power level greater than PM Min, but it will not be less than PM Min. Therefore, if a TOSA is measured to be have less output power than PM Min with an $I_{max}$ bias current, then the TOSA does not fall within the required range of slope efficiencies and/or otherwise fails to meet specification, possibly due to poor alignment, a distorted lens at extreme temperatures, or early roll-off by the laser die.

The second key feature of this model is that, at PM Max, the bias current of the laser will always be higher than the $K_{min}$ limit. This is due to the maximum slope efficiency SE Max 400, which ensures that the minimum current necessary to drive a TOSA at the PM Max level is sufficient to meet the $K_{min}$ limit. While slope efficiencies between SE Max 400 and SE Min 404 may require a greater input bias current than that sufficient to meet the $K_{min}$ limit, the SE Max 400 limit guarantees that this limit will at least be met. If, while driving the module at PM Max, the $K_{min}$ limit is not met, then the TOSA has again failed to meet the specification.

Thus, in the TOSA specification shown in FIG. 9, if a TOSA meets the $K_{min}$ and $I_{max}$ limits, while staying within the PM Max and PM Min limits for the module, that TOSA will by definition be within the acceptable operating range 402. Except for cases such as poor laser alignment or distorted laser lens, most TOSAs will meet these requirements at normal operating temperatures, as the difference between slope efficiencies between lasers at the end-ranges of the normal temperature range is not that great, and will most likely fall between SE Max 400 and SE Min 404. But, outside of the normal temperature range, at "extreme" temperatures, the difference between the maximum and minimum slope efficiencies is greater. Also, the current window between $K_{min}$ and $I_{max}$ may shrink, because $I_{th}$ (defining $K_{min}$) is temperature-dependent.

Figure 10A:
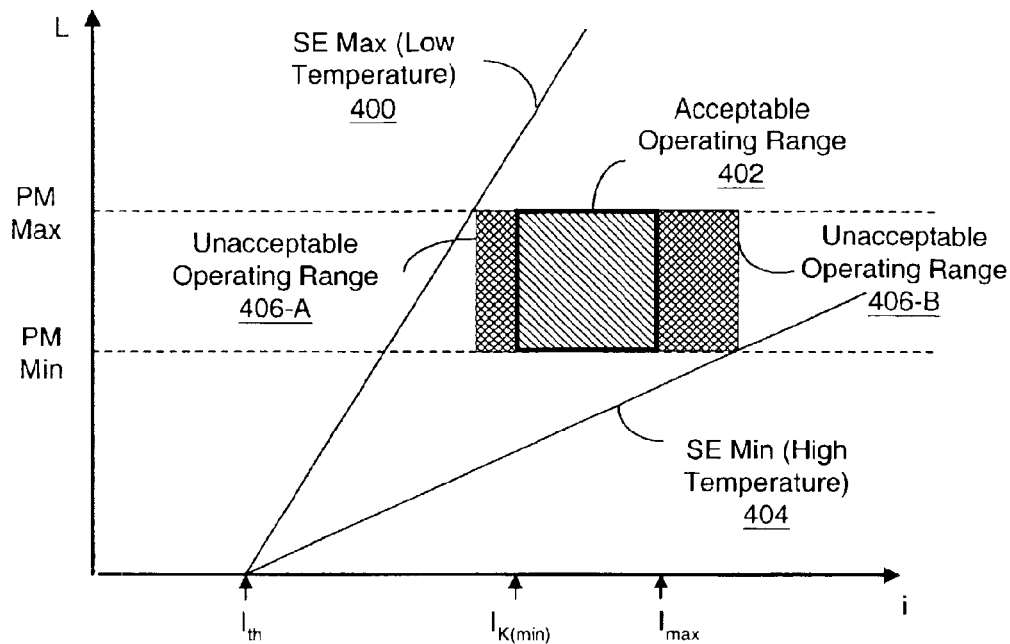
FIG. 10A shows a graph of TOSA specifications based on improper-biasing at extreme temperatures.

Referring to FIG. 10A, a TOSA specification for extreme temperatures is shown. This graph may reflect, for example, an operating range of –20 deg Celsius to 100 deg Celsius. Just as with the graph shown in FIG. 9, maximum and minimum slope efficiencies are first determined at both of the end-range temperatures (i.e., –20 deg and 100 deg Celsius). From these two sets of slope efficiencies, the innermost overlapping slope efficiencies are chosen and defined to be SE Max 400 (from the –20 deg Celsius slope efficiencies), and SE Min 404 (from the 100 deg Celsius slope efficiencies). Note that, due to the extreme operating temperatures, the difference between SE Max 400 and SE Min 404 is greater than in FIG. 9. This becomes problematic when the standard module maximum and minimum power levels (PM Max and PM Min) are retained, because, for example, operating at the PM Max level no longer guarantees that the $K_{min}$ limit will be attained. In other words, if a TOSA had a slope efficiency corresponding to SE Max 400, then operating that TOSA at the PM Max level would cause the module to be in unacceptable operating range 406-A.

Similarly, if a TOSA had a slope efficiency corresponding to SE Min 404, then operating it at a module output power of PM Min would require more bias current than the $I_{max}$ limit allows. Hence, operating a TOSA with this slope efficiency would lead to module operation in unacceptable operating range 406-B. A TOSA falling within unacceptable operating ranges 406-A or 406-B would normally be considered to have failed specifications, and would not be used. However, this "failure" is more likely due to inadequate laser operation at extreme temperatures than a defective TOSA. Clearly, the standard biasing technique used in FIGS. 9 and 10A is not well-suited for measuring TOSA performance at extreme temperatures.

Thus, to more accurately measure TOSA functionality at extreme temperatures, a different biasing for determining the TOSA specification must be used. As discussed, the biasing scheme of FIG. 10A causes the upper end of the spread of slope efficiencies to fail for current lower than the $K_{min}$ limit. In effect, this is because the maximum module power (PM Max) is set too low for the operating conditions, e.g., the extreme low temperature. Similarly, the biasing scheme in FIG. 10A causes the lower end of the spread of slope efficiencies to fail for current exceeding $I_{max}$. This is because the minimum module power (PM Min) is set too high for the operating conditions, e.g., the extreme high temperature.

Figure 10B:
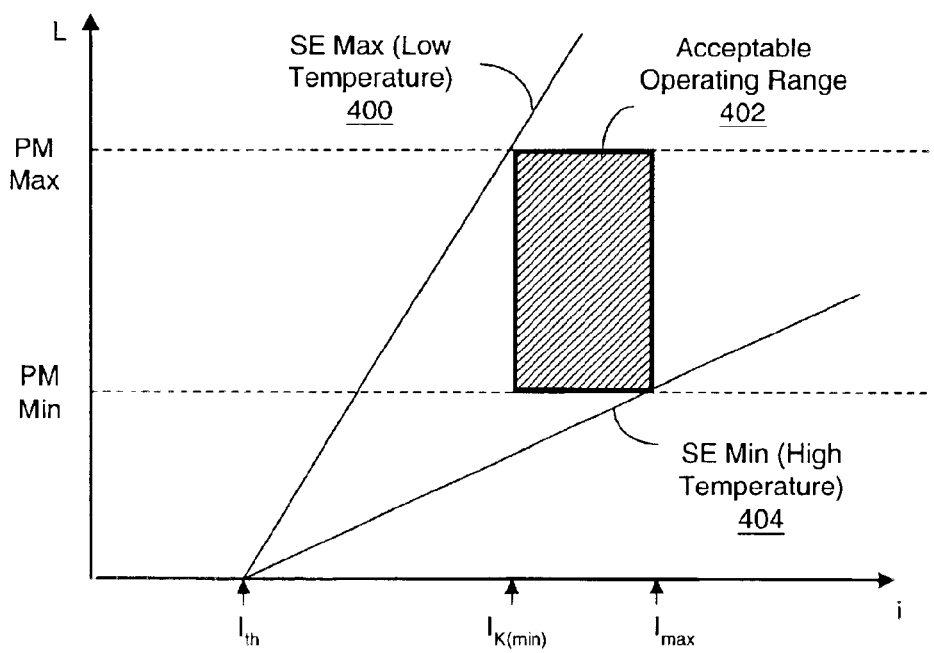
FIG. 10B shows the same graph as FIG. 10A, but with proper biasing.

But, as shown in FIG. 10B, if the module is biased to a higher power output (higher PM Max) for extreme low temperatures, or is biased to a lower power output (lower PM Min) for extreme high temperatures, the module can still meet the TOSA specifications even at these extreme temperatures. In other words, the same SE Max 400 and SE Min 404 depicted in FIG. 10A, reflecting an extreme temperature range of –20 to 100 deg Celsius, will ensure that the $K_{min}$ and $I_{max}$ limits are met across the entire range of operating temperatures. As a result, any TOSA with a slope efficiency between SE Max 400 and SE Min 404 will be within the acceptable operating range 402.

Figure 11A:
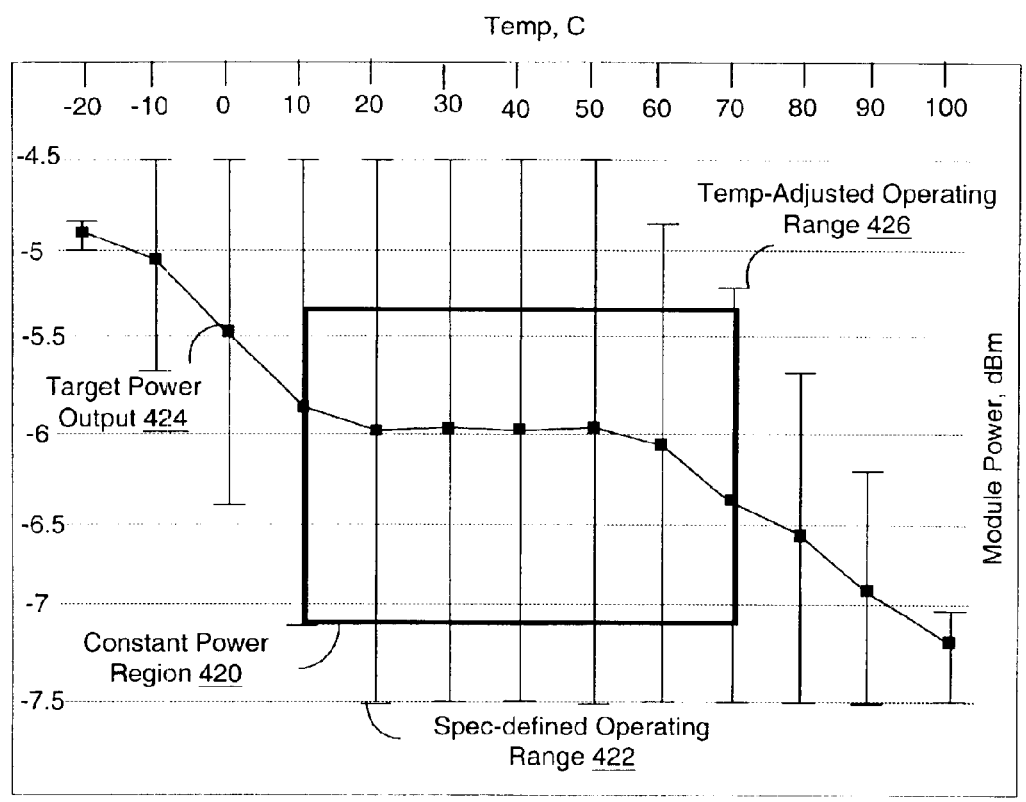
FIG. 11A is a graph depicting acceptable operating ranges for Laser Type 1 at a range of temperatures.
Figure 11B:
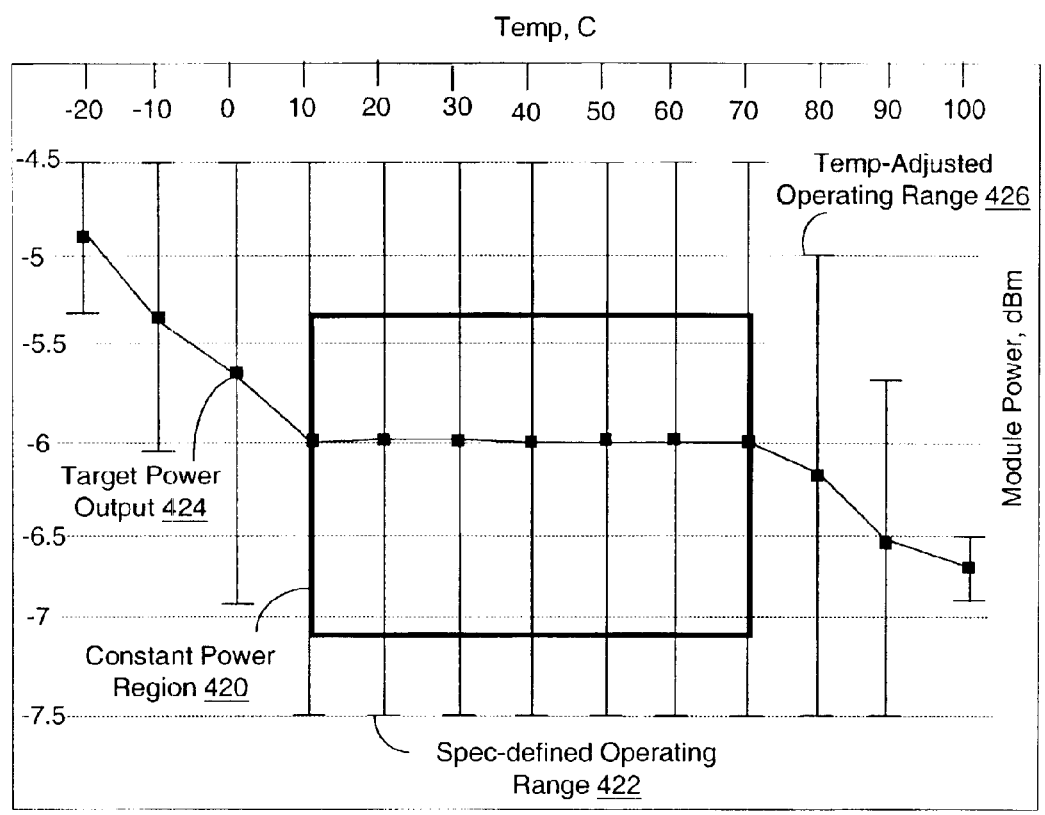
FIG. 11B is a graph depicting acceptable operating ranges for Laser Type 2 at a range of temperatures.
Figure 11C:
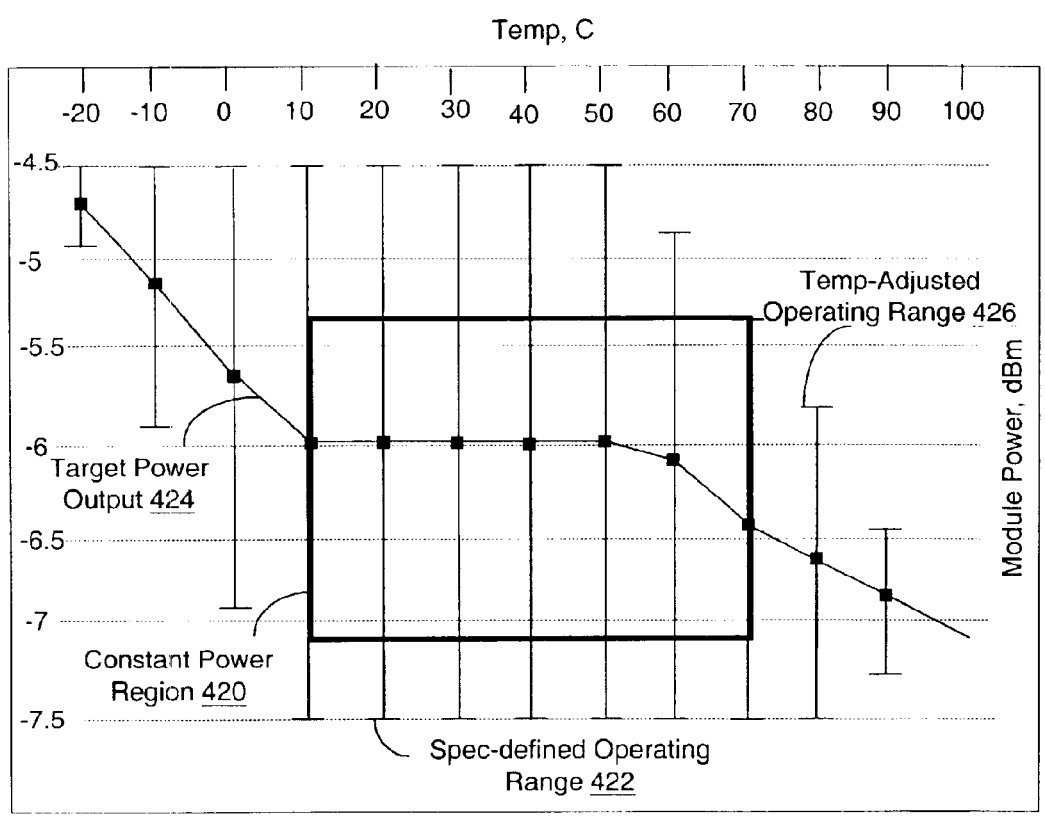
FIG. 11C is a graph depicting acceptable operating ranges for Laser Type 3 at a range of temperatures.

In order to experimentally determine what "normal" temperature range a laser could be biased at using the constant-power technique described in the first part of this specification, and what "extreme" temperatures require deviation away from the constant-power algorithms, the inventors analyzed several types of lasers from different manufacturers. FIGS. 11A–C reflect the results of this analysis for the different laser types. The vertical axis of FIGS. 11A–C represents module power, in negative dB milliwatts. The horizontal axis of FIGS. 11A–C represents temperature, in degrees Celsius.

Also depicted in FIGS. 11A–C are a series of vertical bars with horizontal ends, i.e., spec-defined operating ranges 422 and temp-adjusted operating ranges 426. These vertical bars reflect, for each of the particular laser types, the allowable module power at various temperatures that ensure that the TOSA specification is met. In other words, if a laser is operated within the module power ranges represented by the vertical bars, the biasing is automatically within the $K_{min}$ and $I_{max}$ limits, just as a laser with a slope efficiency between SE Min and SE Max in FIG. 9 met these limits. More particularly, the top-most end of each vertical bar is affected by the $I_{max}$ limit, and the bottom-most end of each vertical bar is affected by the $K_{min}$ limit.

Thus, referring to FIG. 11A, an analysis of Laser Type 1 (e.g., a Honeywell ox Vcsel TOSA) is shown. The graph shows the acceptable operating range (range of module power levels that meet specifications) for every ten degrees between –20 deg Celsius and 100 deg Celsius. For example, at –10 deg Celsius, the operating range for Laser Type 1 is –4.5 dBm to –5.7 dBm. The middle of the operating ranges at each temperature is marked by a small block, and the blocks are interconnected by a line. The blocks are located at the center of the operating range for each temperature, and the interconnecting line depicts the target power output 424. Thus, if a TOSA is biased to operate at the target power output 424 for a particular temperature, and the module is actually operating at that temperature, then the TOSA should easily meet specifications because the power output will be in the middle of a range that meets both the $K_{min}$ and $I_{max}$ limits at the end points.

Note that there are two different types of vertical bars. The vertical bars that extend the entire length of the graph, from –4.5 dBm to –7.5 dBm, are the spec-defined operating ranges 422. At the temperatures corresponding to spec-defined operating ranges, a Laser Type 1 TOSA could operate at the full range of specification-defined power output, and still meet $K_{min}$ and $I_{max}$ limits. The current industry specification for TOSA operation requires operation from −4 dBm to −9 dBm. As shown in FIG. 11A, for purposes of the present invention, this specification has been further reduced and shrunk to −4.5 dBm to −7.5 dBm. Thus, these specification-defined values set the end-points of the spec-defined operating ranges 422, rather than inherent limitations of the particular laser, for the range of temperatures in the middle of the graph.

The other type of vertical bar is the temp-adjusted operating range 426, located both at the extreme high and extreme low temperatures. To understand how these bars were determined, it is useful to reconsider FIG. 10B. Recall that, for extreme low temperatures, if the biasing were adjusted so that the maximum module power output (PM Max) was increased, a TOSA could still meet the acceptable operating range 402 at these low temperatures, because the $K_{min}$ limit could still be met.

This shift is reflected in FIG. 11A by the shortening of the temp-adjusted operating ranges 426 toward the top of the graph, representing an increase in the module power. (The greater the negative dBm number, the smaller the value; e.g., −6.5 dBm is more power than −7.0 dBm). Thus, where the spec-defined operating range 422 for 20 deg Celsius can be as low as −7.5 dBm, the temp-adjusted operating range 426 for 10 deg Celsius is increased to −7.1 dBm, and the temp-adjusted operating range 426 for 0 deg Celsius is increased to −6.4 dBm. Thus, the target power output 424 increases for these lower temperatures, and, like the increased PM Max of FIG. 10B, this ensures that the TOSA specification can still be met even at these extreme low temperatures.

For the temp-adjusted operating range 426 of the extreme high temperatures, recall from FIG. 10B that the minimum module power (PM Min) was decreased, i.e., the laser was biased to a lower power output level. This shift is reflected in FIG. 11A by the shortening of the temp-adjusted operating ranges toward the bottom of the graph, representing a decrease in the module power. Thus, where the spec-defined operating range 422 for 50 deg Celsius can be as high as −4.5 dBm, the temp-adjusted operating range 426 for 60 deg Celsius is −4.8 dBm, and the temp-adjusted operating range 426 for 70 deg Celsius is −5.2 dBm. The target power output 424 correspondingly decreases for these higher temperatures and, like the decreased PM Min of FIG. 10B, ensures that the TOSA specification is met for the extreme high temperatures.

After these calculations were made for Laser Type 1 in FIG. 11A; Laser Type 2 in FIG. 11B (e.g., an Emcore ox Vcsel TOSA); and Laser Type 3 in FIG. 11C (e.g., an OO7 ox Vcsel TOSA), and the data was plotted, an additional determination could be made for the three lasers. By identifying temperature ranges where the target power output 424 was essentially flat, and where the target power output 424 overlapped amongst the various lasers, a constant power region 420 was determined. This was useful because the constant power region 420 common to all three lasers can utilize the constant-power-targeting techniques described above in the first part of this specification to ensure desirable performance of the lasers over a range of temperatures.

Figure 11D:
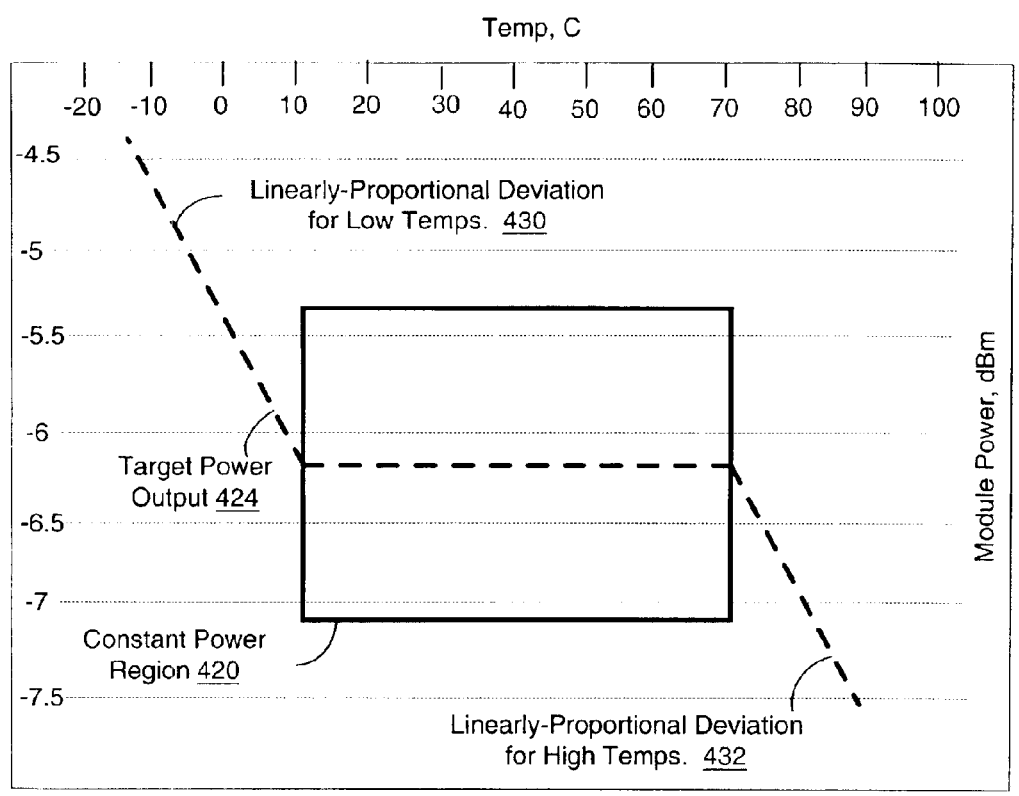
FIG. 11D is a target power overlay based on the graphs of FIGS. 11A–C.

In addition to the constant power region 420, the roughly linear deviation of the target power output 424 away from the constant power region, in opposite directions for the high and low temperatures, was also useful. From this data, a model, or overlay, for the target power output could be developed. An example of such an overlay is shown in FIG. 11D. In this figure, the constant power region 420 frames a region of constant-power output of about −6.2 dBm, while the linearly-proportional deviation for low temperatures 430 increases this level, and the linearly-proportional deviation for high temperatures 432 decreases this level. In the example shown, the extreme low and extreme high temperatures deviate away from the constant power region 420 by about 0.8 dBm for every 10 deg below 10 deg Celsius, or above 70 deg Celsius, respectively.

While the specified deviation methodology shown in FIG. 11D for the extreme temperatures is linear, in other embodiments, it may be non-linear, proportional, or based on any other type of modeling. Alternatively, a straight targeting of calculated target power output values can be used.

Figure 12A:
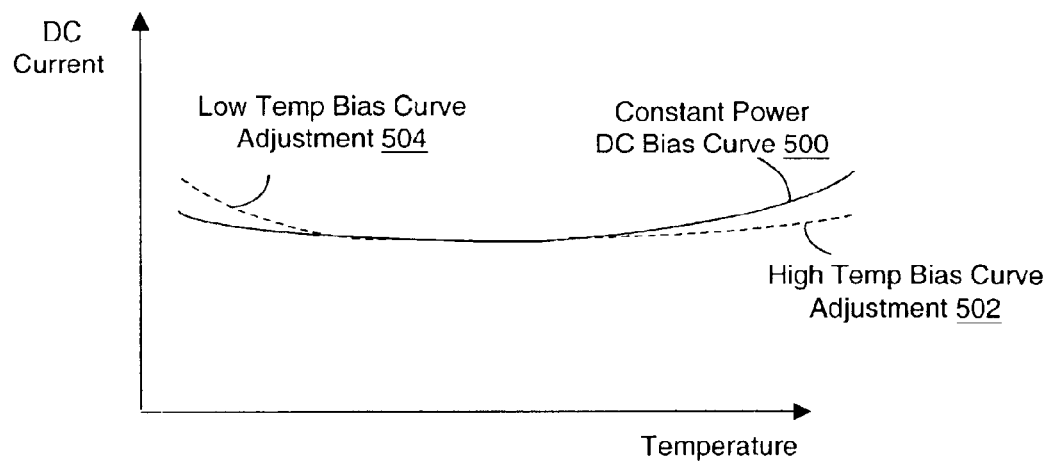
FIG. 12A is a plot of an exemplary DC bias curve and extreme temperature deviations away therefrom.

Referring to FIG. 12A, a plot of a typical constant-power DC bias curve 500 is shown. Recall that during calibration of a TOSA transceiver 100, a set of control values for DC bias current and AC current swing are generated and stored in a temperature lookup table 300 (see FIG. 8) using the constant-power-targeting techniques described in the first part of this specification. Additional fill-in values are interpolated or extrapolated from these control values. If the control values for the DC bias current across a wide range of temperatures is plotted, a curve like the constant-power DC bias curve 500 results. However, using the modified power-targeting for extreme high and extreme low temperatures described above results in departures from this curve. At extreme low temperatures, because the module power is increased, more DC bias current is necessary to drive the transceiver, as shown by the low-temp bias curve adjustment 504. At extreme high temperatures, because the module power is decreased, less DC bias current is necessary, as shown by high-temp bias curve adjustment 502.

Figure 12B:
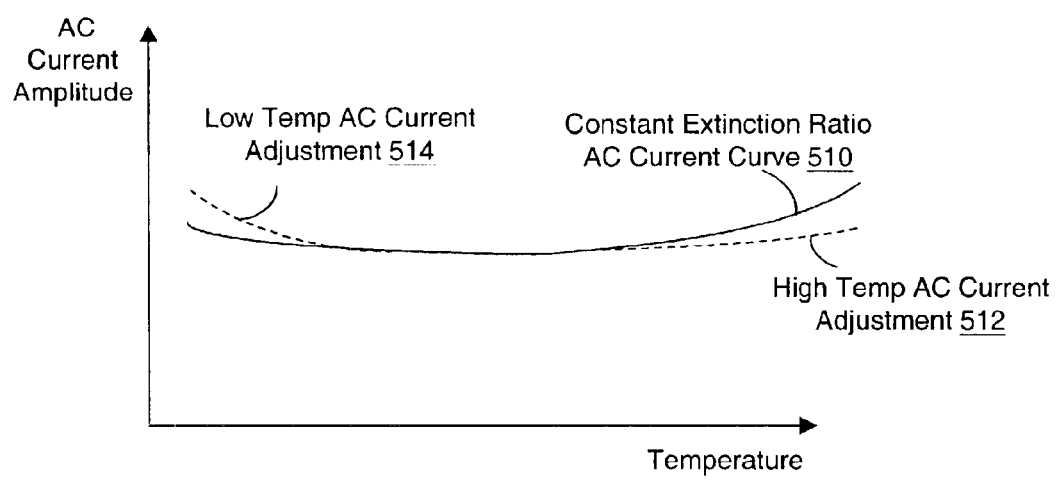
FIG. 12B is a plot of an exemplary AC current swing bias curve and extreme temperature deviations away therefrom.

In FIG. 12B, the adjustments to the constant-extinction ratio AC current curve 510, i.e., the control values which drive the AC current swing, are shown. The AC current swing must be adjusted in addition to adjustments to the DC bias because adjusting the DC bias current changes the signal-to-noise ratio (SNR). In other words, because the SNR relates the AC current swing to the DC bias current, if, for example, the DC bias current is increased while the AC current swing remains static, the SNR may decrease. Thus, similar deviations to the constant power DC bias curve 500 in FIG. 12A are made to the constant-extinction ratio AC current curve 500 in FIG. 12B. However, instead of having to conduct extinction-ratio targeting, the low-temp AC current adjustment 514 and high-temp AC current adjustment 512 can be mathematically derived from the low-temp bias curve adjustment 504 and the high-temp bias curve adjustment 502 shown in FIG. 12A, respectively. For example, if the DC bias current changes by 1%, the AC current swing changes by 1%.

In other embodiments, the deviations from the constant-extinction ratio AC current curve 510 are determined by calculating deviations away from a constant-extinction ratio output at extreme temperatures, and then determining the low-temp AC current adjustment 514 and the high-temp AC current adjustment 512 by targeting those deviations at those temperatures.

Figures 13A, 13B:
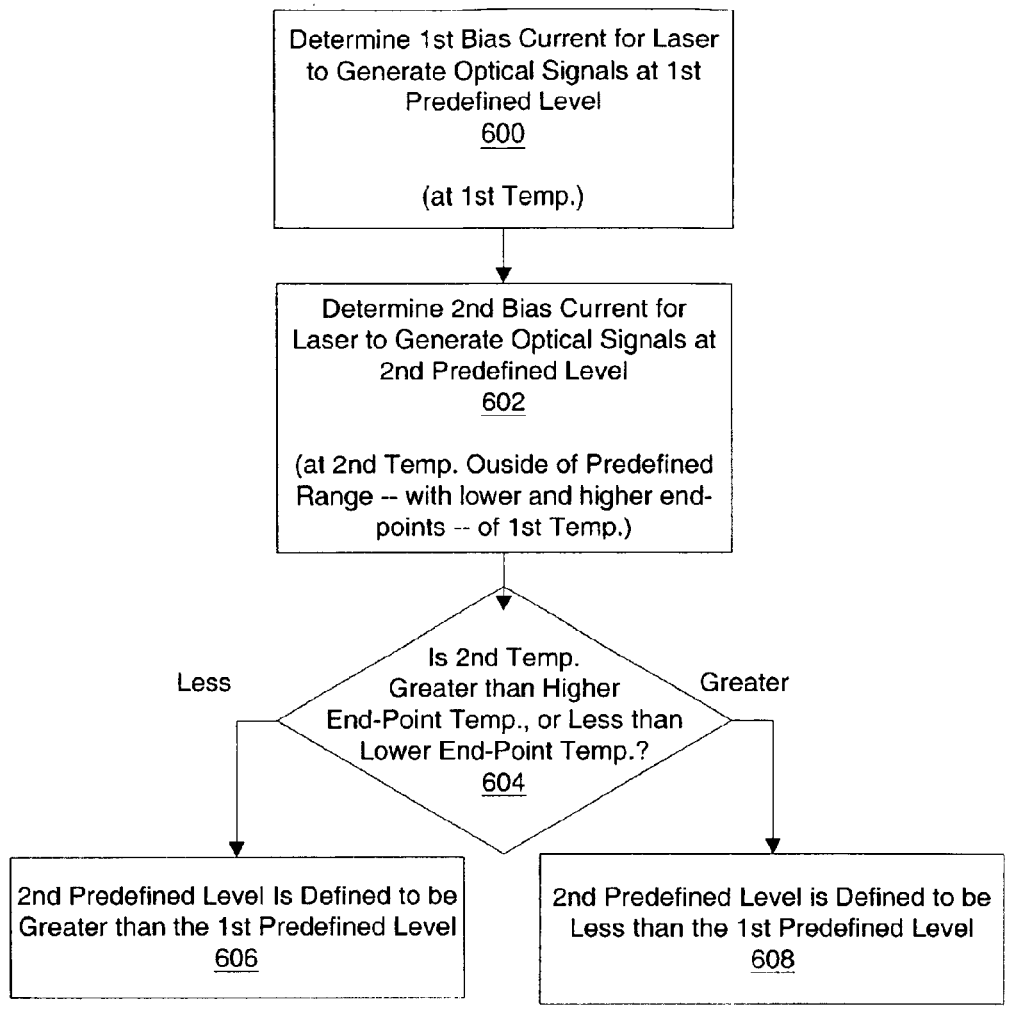
FIG. 13A shows a method of maintaining desirable optical performance of a laser at extreme temperatures, in accordance with one embodiment of the invention.
FIG. 13B shows further detail on two of the steps of the method shown in FIG. 13A.

Referring to FIG. 13A, a method of maintaining desirable performance of a laser is shown. A first bias current is determined at a first temperature that causes the laser to generate optical signal at a first predefined level (600). Then, a second bias current is determined at a second temperature that causes the laser to generate optical signals at a second predefined level (602). The second temperature is outside of a predefined range of the first temperature, wherein the range includes a lower end-point temperature and a higher end-point temperature.

Next, a determination of whether the second temperature is greater than the higher end-point temperature, or less than the lower end-point temperature, is necessary (604). If the second temperature is greater than the higher end-point temperature, then the second predefined level is defined to be less than the first predefined level (608). In a more specific example shown in FIG. 13B, the second predefined level is defined to be less than the first predefined level in proportion to a difference in temperature between the second temperature and the higher end-point temperature (612).

Referring back to FIG. 13A, if the second temperature is less than the higher endpoint temperature, the second predefined level is defined to be greater than the first predefined level (606). Again, in a more specific example shown in FIG. 13B, the second predefined level is defined to be greater than the first predefined level in proportion to a difference in temperature between the second temperature and the lower end-point temperature (610).

Figure 14:
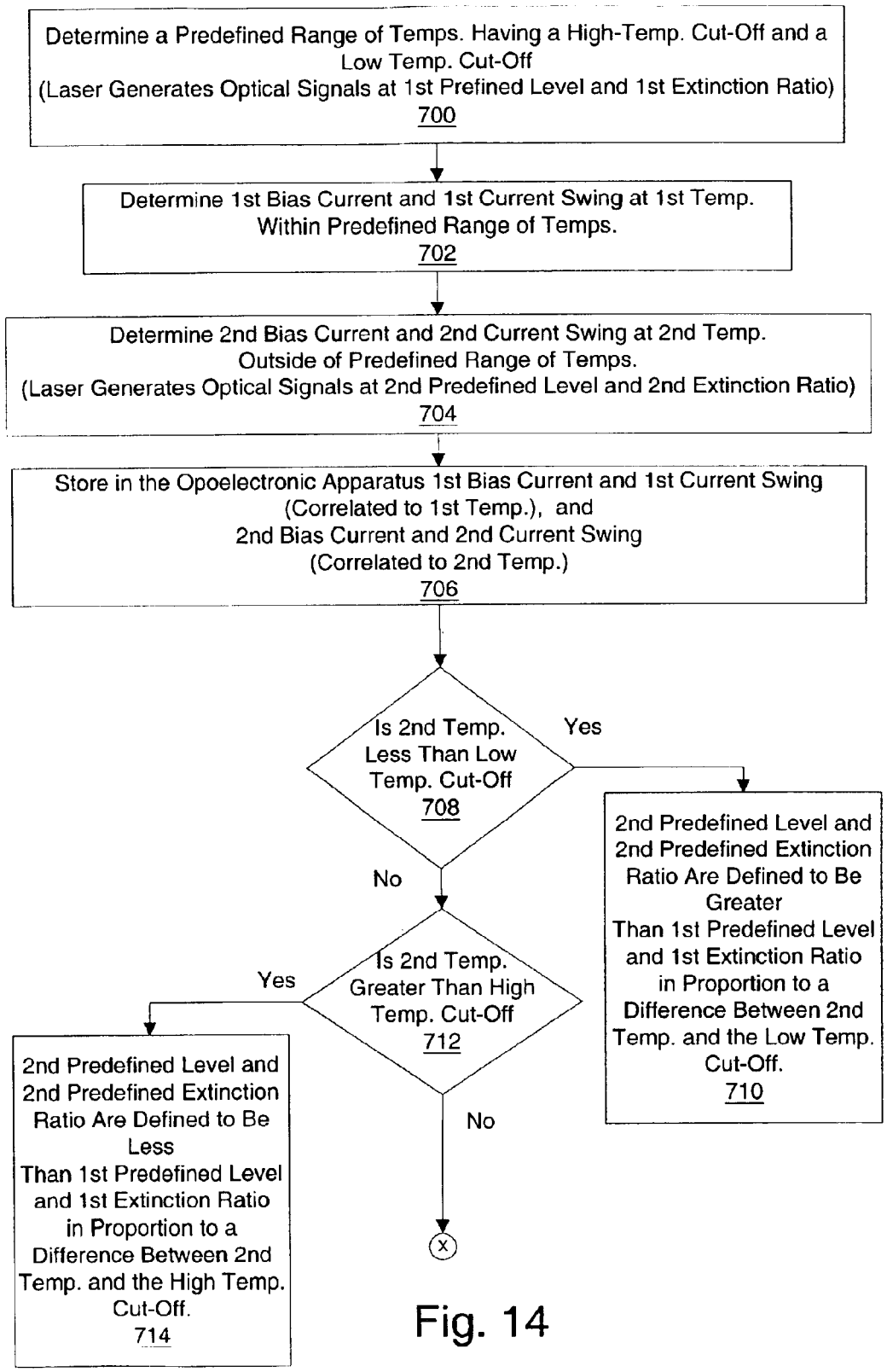
FIG. 14 depicts another method of maintaining desirable optical performance of a laser at extreme temperatures, in accordance with another embodiment.

Turning to FIG. 14, another method of maintaining desirable optical performance of a laser is shown. In this method, a predefined range of temperatures having a high-temperature cut-off and a low-temperature cut-off is first determined (700). The predefined range of temperatures corresponds to the laser generating optical signals at a first predefined level and a first predefined extinction ratio. Next, a first bias current and a first current swing, corresponding to a first temperature within the predefined range of temperatures, are determined, at which the laser generates optical signals at the first predefined level and the first predefined extinction ratio (702). Then, a second bias current and a second current swing, corresponding to a second temperature outside of the predefined range of temperatures, are determined, at which the laser generates optical signals at the second predefined level and the second predefined extinction ratio (704). The first bias current and first current swing are stored in an optoelectronic apparatus, correlated to the first temperature, as are the second bias current and the second current swing, correlated to the second temperature (706).

Next, a determination is made as to whether the second temperature is less than the low-temperature cut-off (708). If it is, the second predefined level and second predefined extinction ratio are defined to be greater than the first predefined level and the first predefined extinction ratio in proportion to a difference between the second temperature and the low-temperature cut-off (710). If the initial determination is not true, than another determination is made as to whether the second temperature is greater than the high-temperature cut-off (712). If it is, the second predefined level and the second predefined extinction ratio are defined to be less than the first predefined level and the first predefined extinction ratio in proportion to a difference between the second temperature and the high-temperature cut-off (714).

While the present invention has been described with reference to a few specific embodiments, the description is illustrative of the invention and is not to be construed as limiting the invention. Various modifications may occur to those skilled in the art having the benefit of this disclosure without departing from the inventive concepts described herein. Accordingly, it is the claims, not merely the foregoing illustration, that are intended to define the exclusive rights of the invention.

What is claimed is:

1. An optoelectronic apparatus comprising:
an optical emitter;
an emitter driver circuit coupled to drive the optical emitter;
a controller circuit coupled to the emitter driver circuit, the controller circuit configured to provide control signals to the emitter driver circuit to maintain consistent optical performance of the optical emitter over a predefined range of temperatures and to deviate from consistent optical performance utilizing a specified deviation methodology for temperatures outside the predefined range of temperatures; and
a memory coupled to the controller circuit and having stored therein temperature values and at least two control values for the emitter driver circuit for at least some temperature values, and the memory further having stored therein a value for controlling an optical emitter bias current and a value for controlling a current swing of the optical emitter in association with at least one of the temperature values;
wherein the controller circuit generates the control signals based at least in part on two of the control values that are associated with the same temperature value in the memory.

2. The optoelectronic apparatus of claim 1, further comprising a temperature sensor to detect an approximate temperature of the optical emitter.

3. The optoelectronic apparatus of claim 1, wherein the controller circuit generates the control signals based at least in part on the approximate temperature of the optical emitter.

4. The optoelectronic apparatus of claim 3, wherein if the approximate temperature is higher than the predefined range of temperatures, the controller circuit provides control signals to the emitter driver circuit so as to decrease optical performance of the optical emitter in accordance with the specified deviation methodology.

5. The optoelectronic apparatus of claim 3, wherein if the approximate temperature is lower than the predefined range of temperatures, the controller circuit provides control signals to the emitter driver circuit so as to increase optical performance of the optical emitter in accordance with the specified deviation methodology.

6. The optoelectronic apparatus of claim 1, wherein the optical emitter comprises a laser.

7. The optoelectronic apparatus of claim 1, wherein the controller circuit and the memory are portions of a single integrated circuit.

8. The optoelectronic apparatus of claim 1, wherein the memory comprises a non-volatile memory.

9. An optoelectronic apparatus comprising:
an optical emitter;
an emitter driver circuit configured and arranged to drive the optical emitter;
a controller IC coupled to the emitter driver circuit, the controller IC being configured to:
provide control signals to the emitter driver circuit so as to facilitate, for a predefined range of temperatures, operation of the optical emitter at a target power output that is within a constant power region; and
provide control signals to the emitter driver circuit so as to facilitate, for temperatures outside the predefined range of temperatures, operation of the optical emitter at a target power output that is outside the constant power region, the control signals for operation outside the constant power region being based upon a specified deviation methodology; and memory coupled to the controller IC and having stored therein temperature values and at least two control values for the emitter driver circuit for at least some temperature values, such that control signals generated by the controller IC are based at least in part on two of the control values that are associated with the same temperature value in the memory.

10. The optoelectronic apparatus as recited in claim 9, wherein the deviation methodology specifies that the target power output outside the constant power region varies with respect to changes in temperature.

11. The optoelectronic apparatus as recited in claim 10, wherein the deviation methodology specifies that at least some variations in the target power output outside the constant power region are one of: substantially linear with respect to changes in temperature; or, substantially non-linear with respect to changes in temperature.

12. The optoelectronic apparatus as recited in claim 9, wherein the deviation methodology specifies that operation of the optoelectronic apparatus meets $K_{min}$ and $I_{max}$ limits for a range of temperatures that encompasses, and extends beyond, the predetermined range of temperatures.

13. The optoelectronic apparatus as recited in claim 9, wherein the optical emitter comprises a VCSEL.

14. The optoelectronic apparatus as recited in claim 9, wherein control signals provided by the controller IC are based at least in part on a temperature of the optical emitter.

15. The optoelectronic apparatus as recited in claim 9, wherein the controller IC includes an $I^2C$ serial interface configured and arranged to permit communication between the optoelectronic apparatus and a host device.

16. The optoelectronic apparatus as recited in claim 9, wherein:
the optical emitter comprises an element of a ROSA configured to communicate with the controller IC; and
the optoelectronic apparatus further comprises a TOSA configured to communicate with the controller IC.

17. The optoelectronic apparatus as recited in claim 9, wherein the memory further has stored therein a value for controlling an optical emitter bias current and a value for controlling a current swing of the optical emitter in association with at least one of the temperature values.

18. The optoelectronic apparatus as recited in claim 9, wherein the controller IC includes a temperature sensor in thermal communication with the optical emitter.

19. An optoelectronic apparatus comprising:

an optical emitter;

an emitter driver circuit configured and arranged to drive the optical emitter;

a controller IC coupled to the emitter driver circuit, the controller IC being configured to:
provide control signals to the emitter driver circuit so as to facilitate, for a predefined range of temperatures, operation of the optical emitter at a target power output that is within a constant power region; and
provide control signals to the emitter driver circuit so as to facilitate, for temperatures outside the predefined range of temperatures, operation of the optical emitter at a target power output that is outside the constant power region; and memory coupled to the controller IC and having stored therein temperature values and control values, one or more control signals of the controller IC being based at least in part on one or more of the stored temperature values and control values.

* * * * *

UNITED STATES PATENT AND TRADEMARK OFFICE
CERTIFICATE OF CORRECTION

PATENT NO. : 6,947,455 B2
APPLICATION NO. : 10/285369
DATED : September 20, 2005
INVENTOR(S) : Chieng et al.

It is certified that error appears in the above-identified patent and that said Letters Patent is hereby corrected as shown below:

Column 3
Line 3, after "FIG. 4" change "show" to --shows--
Line 9, after "undergoing" insert --a--

Column 9
Line 36, before "L-I" insert --a--
Line 55, change "X=LDI $_{pT-LDIp25}$," to --X=LDI$_{pT}$–LDI$_{p25}$,--

Column 11
Line 49, before "LRP1$_{p25}$" insert --where--
Line 49, change "LDII$_{p25}$" to -- LDI$_{p25}$, --

Column 17
Line 13, change "extreme high" to --extreme, high--
Line 14, change "extreme low" to --extreme, low--
Line 16, change "extreme low" to --extreme, low--
Line 33, change "extreme low" to --extreme, low--
Lines 35 and 36, change "extreme high" to --extreme, high--
Line 48, change "extreme high" to --extreme, high--

Column 18
Line 7, change "extreme low and extreme high" to --extreme, low and extreme high--
Line 33, change "extreme high" to --extreme, high--
Line 65, change "optical signal" to --optical signals--

Signed and Sealed this

Thirtieth Day of November, 2010

David J. Kappos
*Director of the United States Patent and Trademark Office*